(12) United States Patent
Tokeshi et al.

(10) Patent No.: US 12,137,537 B2
(45) Date of Patent: Nov. 5, 2024

(54) LIQUID FEEDER AND COOLING UNIT

(71) Applicant: Nidec Corporation, Kyoto (JP)

(72) Inventors: Toshihiko Tokeshi, Kyoto (JP); Takehito Tamaoka, Kyoto (JP); Naoyuki Takashima, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 438 days.

(21) Appl. No.: 17/515,802

(22) Filed: Nov. 1, 2021

(65) Prior Publication Data
US 2022/0151101 A1 May 12, 2022

(30) Foreign Application Priority Data
Nov. 6, 2020 (JP) .................................. 2020-185898

(51) Int. Cl.
*H05K 7/20* (2006.01)

(52) U.S. Cl.
CPC ..... *H05K 7/20272* (2013.01); *H05K 7/20254* (2013.01); *F28F 2250/08* (2013.01)

(58) Field of Classification Search
CPC ........... H05K 7/20272; H05K 7/20254; H05K 7/20218; F28F 2250/08; F04D 29/4293; F04D 1/00; F04D 29/426; F04D 13/06
See application file for complete search history.

(56) References Cited

U.S. PATENT DOCUMENTS

| | | | |
|---|---|---|---|
| 7,325,591 B2 | 2/2008 | Duan et al. | |
| 9,927,181 B2 * | 3/2018 | Mounioloux | G06F 1/20 |
| 10,409,341 B2 * | 9/2019 | Tsai | G06F 1/20 |
| 10,455,732 B2 * | 10/2019 | Pan | F28D 15/00 |
| 2015/0252808 A1 * | 9/2015 | Rosinski | F04D 13/06 417/423.5 |
| 2017/0030358 A1 * | 2/2017 | Fischer | F04D 1/00 |
| 2019/0339026 A1 * | 11/2019 | Chen | F28F 9/0246 |
| 2020/0124337 A1 | 4/2020 | Tokeshi et al. | |
| 2020/0198349 A1 * | 6/2020 | Uchida | B41J 2/14233 |
| 2020/0198362 A1 * | 6/2020 | Uchida | B41J 2/14233 |
| 2020/0263680 A1 * | 8/2020 | Bourne | F04D 13/06 |
| 2020/0344912 A1 * | 10/2020 | Lai | H05K 7/20272 |

FOREIGN PATENT DOCUMENTS

| | | |
|---|---|---|
| JP | H0735102 A | 2/1995 |
| JP | 2020065009 A | 4/2020 |

* cited by examiner

*Primary Examiner* — Adam B Dravininkas
(74) *Attorney, Agent, or Firm* — Keating & Bennett, LLP

(57) ABSTRACT

A liquid feeder includes a first casing with a flow path, and a pump. An upstream flow path located upstream of the pump and communicating with a pump inlet includes a first flow path, a second flow path, a third flow path, a fourth flow path, a fifth flow path, and a sixth flow path that are located on one side in a first direction, another side in the first direction, one side in a second direction, another side in the third direction, one side in the third direction, and another side in the third direction with respect to the pump inlet, respectively.

14 Claims, 19 Drawing Sheets

LIQUID FEEDER AND COOLING UNIT

CROSS-REFERENCE TO RELATED APPLICATIONS

The present application claims priority under 35 U.S.C. § 119 to Japanese Patent Application No. 2020-185898, filed on Nov. 6, 2020, the entire disclosures of which are hereby incorporated herein by reference.

FIELD OF THE INVENTION

The present disclosure relates to a liquid feeder and a cooler.

BACKGROUND

A liquid feeder that feeds liquid using a pump is used in various apparatuses. In one example, the liquid feeder is used in a cooling apparatus that circulates a refrigerant for cooling a heat generating component. It has been studied to incorporate a cold plate in a liquid feeder having a pump.

A liquid-cooled heat radiating device in which a pump (liquid drive unit) having an impeller and a cold plate are disposed in a casing is known. In the conventional liquid-cooled heat radiating device, after the heat of the heat source is absorbed by causing the liquid flowing in from the inflow port to flow to the cold plate attached to the heat source by the pump, the liquid flows to the heat radiating fin through the duct and is cooled, and returns to the liquid-cooled heat radiating device again.

In the conventional liquid cooling device, a liquid may evaporate from the duct. This case may cause a liquid near the pump to be insufficient, so that the pump may idle to cause the liquid not to be sufficiently circulated.

SUMMARY

An example embodiment of a liquid feeder of the present invention includes a first casing and a pump. The first casing includes an inflow port into which liquid flows, an outflow port from which liquid flows out, and a flow path connecting the inflow port and the outflow port. The pump is in the flow path of the first casing and circulates the liquid. The pump includes a pump inlet through which liquid flows in and a pump outlet through which liquid flows out. The flow path includes an upstream flow path located upstream of the pump and communicating with the pump inlet, and a downstream flow path located downstream of the pump and communicating with the pump outlet. The upstream flow path includes a first flow path located on a first side in a first direction with respect to the pump inlet, a second flow path located on a second side in the first direction with respect to the pump inlet, a third flow path located on a first side in a second direction orthogonal to the first direction with respect to the pump inlet, a fourth flow path located on a second side in the second direction with respect to the pump inlet, a fifth flow path located on a first side in a third direction orthogonal to the first direction and the second direction with respect to the pump inlet, and a sixth flow path located on a second side in the third direction with respect to the pump inlet.

An example embodiment of a cooler of the present invention includes the liquid feeder described above, an inflow pipe connected to the inflow port of the liquid feeder, an outflow pipe connected to the outflow port of the liquid feeder, and a radiator connected to at least one of the inflow pipe and the outflow pipe.

The above and other elements, features, steps, characteristics and advantages of the present disclosure will become more apparent from the following detailed description of the example embodiments with reference to the attached drawings.

DETAILED DESCRIPTION

Figure 1A:
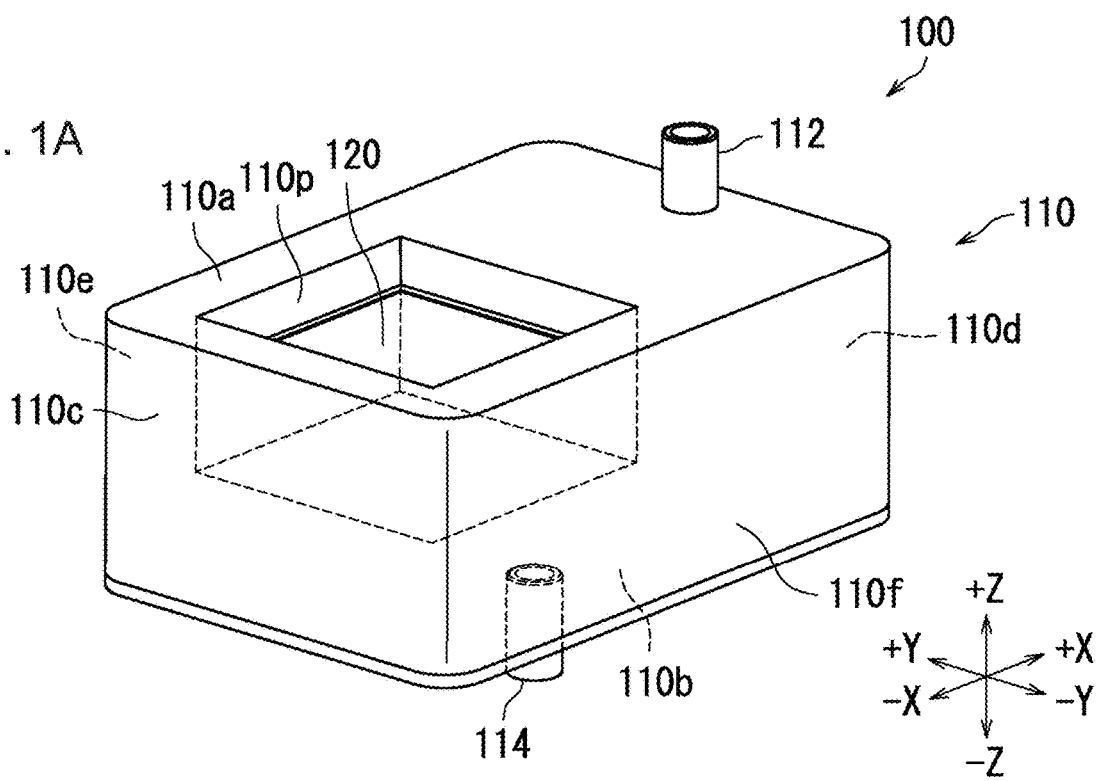
FIG. 1A is a schematic perspective view of a liquid feeder of a first example embodiment of the present invention.

Hereinafter, example embodiments of the present invention will be described with reference to the accompanying drawings. The same or corresponding parts in the drawings are designated by the same reference numerals, and description thereof will not be duplicated. This specification may describe an X-axis, a Y-axis, and a Z-axis orthogonal to each other to facilitate understanding of the invention. Typically, any one of the X-axis, Y-axis, and Z-axis is parallel to the vertical direction, and the remaining two are parallel to the horizontal direction. However, the orientations of the X axis, the Y axis, and the Z axis are not limited thereto.

First, a liquid feeder 100 of a first example embodiment will be described with reference to FIGS. 1A and 1B. FIG. 1A is a schematic perspective view of the liquid feeder 100, and FIG. 1B is a schematic partial perspective view of the liquid feeder 100.

The liquid feeder 100 sequentially feeds liquid. For example, the liquid feeder 100 is used for circulation of liquid. The liquid feeder 100 can circulate the liquid by sequentially feeding the liquid.

In the liquid feeder 100, the liquid to be fed may be water. Alternatively, the liquid may be a mixed liquid. For example, the mixed liquid may contain water and propylene glycol.

Figure 1B:
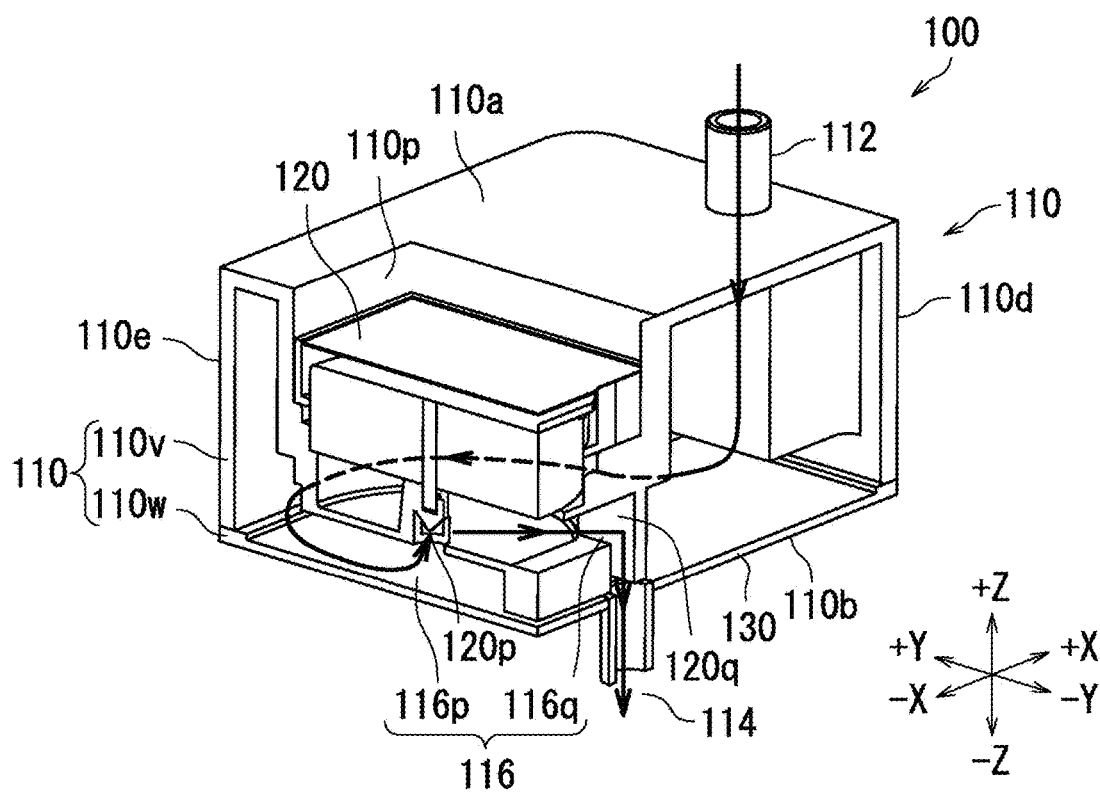
FIG. 1B is a schematic partial perspective view of the liquid feeder of the first example embodiment.

In the liquid feeder 100 shown in FIGS. 1A and 1B, a pump 120 is positioned vertically above, but the pump 120 may not be positioned vertically above. The liquid feeder 100 may face in a direction in which the pump 120 is positioned at a place other than the vertically upper side.

As illustrated in FIGS. 1A and 1B, the liquid feeder 100 includes a first casing 110 and a pump 120. The first casing 110 has an inflow port 112, an outflow port 114, and a flow path 116. Liquid flows into the inflow port 112. The liquid flows out through the outflow port 114. The flow path 116 connects the inflow port 112 and the outflow port 114. Therefore, when liquid flows in from the inflow port 112 of the first casing 110, the liquid flows through the flow path 116 and flows out from the outflow port 114 to the outside. The pump 120 is disposed in the flow path 116 of the first casing 110. The liquid is circulated by the pump 120.

The first casing 110 has a substantially rectangular parallelepiped shape. The first casing 110 has a first outer main surface 110a, a second outer main surface 110b, a first outer side surface 110c, a second outer side surface 110d, a third outer side surface 110e, and a fourth outer side surface 110f. The first outer side surface 110c and the second outer side surface 110d are connected to the first outer main surface 110a and the second outer main surface 110b, respectively. The third outer side surface 110e and the fourth outer side surface 110f are connected to the first outer main surface 110a, the second outer main surface 110b, the first outer side surface 110c, and the second outer side surface 110d, respectively. The first outer main surface 110a is located on the +Z direction side, and the second outer main surface 110b is located on the −Z direction side. The first outer side surface 110c is located on the −X direction side, and the second outer side surface 110d is located on the +X direction side. The third outer side surface 110e is located on the +Y direction side, and the fourth outer side surface 110f is located on the −Y direction side.

The first outer main surface 110a is provided with a recess 110p. The recess 110p is located on the −X direction side of the entire first outer main surface 110a. The pump 120 is disposed in the recess 110p of the first outer main surface 110a. The pump 120 can be fitted into the recess 110p of the first outer main surface 110a of the first casing 110.

In the present specification, the X direction, the Y direction, and the Z direction may be referred to as a first direction, a second direction, and a third direction, respectively. Furthermore, in the present specification, the +X direction side and the −X direction side may be referred to as one side in the first direction and the other side in the first direction, respectively. Similarly, the +Y direction side and the −Y direction side may be referred to as one side in the second direction and the other side in the second direction, respectively, and the +Z direction side and the −Z direction side may be referred to as one side in the third direction and the other side in the third direction, respectively. Therefore, the first outer main surface 110a is located on one side in the third direction, and the second outer main surface 110b is located on the other side in the third direction. The second outer side surface 110d is located on one side in the first direction, and the first outer side surface 110c is located on the other side in the first direction. The third outer side surface 110e is located on one side in the second direction, and the fourth outer side surface 110f is located on the other side in the second direction.

Here, the inflow port 112 is provided in the first outer main surface 110a of the first casing 110. The inflow port 112 protrudes from the first outer main surface 110a toward the +Z direction side. The outflow port 114 is provided in the second outer main surface 110b. The outflow port 114 protrudes from the second outer main surface 110b toward the −Z direction side.

Liquid can be circulated by the pump 120. The pump 120 has a pump inlet 120p and a pump outlet 120q. Liquid flows into the pump 120 from the pump inlet 120p. The liquid flows out from the pump outlet 120q. The pump inlet 120p and the pump outlet 120q are located in the recess 110p of the first outer main surface 110a of the first casing 110.

The pump 120 is disposed in the flow path 116 of the first casing 110. The flow path 116 is formed in a region surrounded by the first outer main surface 110a, the second outer main surface 110b, the first outer side surface 110c, the second outer side surface 110d, the third outer side surface 110e, and the fourth outer side surface 110f of the first casing 110. The flow path 116 includes an upstream flow path 116p and a downstream flow path 116q. The upstream flow path 116p is located upstream of the pump 120. The upstream flow path 116p communicates with the pump inlet 120p. The liquid flowing in from the inflow port 112 flows to the pump inlet 120p through the upstream flow path 116p. The downstream flow path 116q is located downstream of the pump 120. The downstream flow path 116q communicates with the pump outlet 120q. The liquid flowing out from the pump outlet 120q flows to the outflow port 114 through the downstream flow path 116q.

Here, the inflow port 112 is located on the first outer main surface 110a, and the outflow port 114 is located on the second outer main surface 110b. Therefore, the liquid flowing in from the inflow port 112 of the first outer main surface 110a reaches the pump 120 through the upstream flow path 116p. The liquid fed by the pump 120 flows out from the outflow port 114 of the second outer main surface 110b to the outside through the downstream flow path 116q.

When liquid is fed using the liquid feeder 100, the liquid flows into the first casing 110 from the inflow port 112 through a pipe connected to the inflow port 112. The liquid flows out of the first casing 110 through a pipe connected to the outflow port 114. In this manner, the liquid flows through the pipe connected to the liquid feeder 100.

The liquid may evaporate from the pipe. In particular, when a relatively inexpensive rubber tube is used as a pipe, the liquid may gradually evaporate from the pipe, and the amount of the liquid circulating through the liquid feeder 100 may decrease. As the amount of liquid decreases, the air may accumulate in the space where the liquid is reduced. When the air enters the pump, the pump cannot circulate the liquid. According to the liquid feeder 100 of the present invention, it is possible to suppress idling of the pump 120 by preventing the air from entering the pump 120 first when the amount of circulating liquid decreases.

Figure 2:
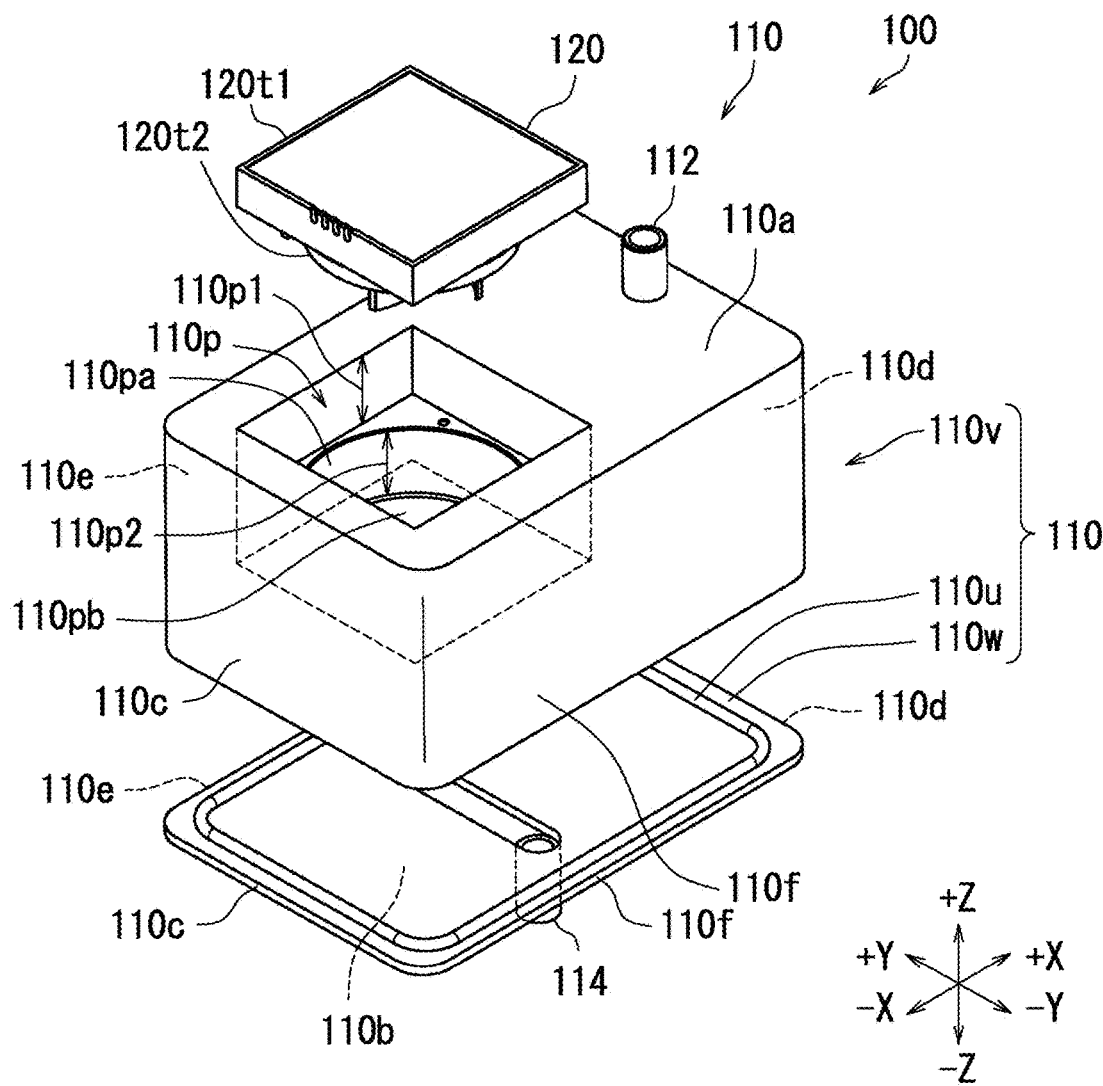
FIG. 2 is a schematic exploded view of the liquid feeder of the first example embodiment.

Next, the liquid feeder 100 of the first example embodiment will be described with reference to FIGS. 1A to 2. FIG. 2 is a schematic exploded perspective view of the liquid feeder 100.

As illustrated in FIG. 2, the recess 110p is provided in the first outer main surface 110a of the first casing 110. The pump 120 is inserted into the recess 110p. The shape of the recess 110p is substantially matched with the outer shape of the pump 120. The thickness (length along the Z-axis direction) of the pump 120 is smaller than the depth (length along the Z-axis direction) of the recess 110p.

The recess 110p of the first outer main surface 110a has a side surface 110pa and a bottom surface 110pb. The bottom surface 110pb has a normal line parallel to the third direction (Z-axis direction).

The recess 110p has a first portion 110p1 and a second portion 110p2. The first portion 110p1 is connected to the second portion 110p2. The first portion 110p1 is located on the +Z direction side with respect to the second portion 110p2. The first portion 110p1 has a substantially rectangular parallelepiped shape, and the second portion 110p2 has a substantially cylindrical shape. An inner diameter (length along the XY plane) of the first portion 110p1 is larger than an inner diameter (length along the XY plane) of the second portion 110p2.

The pump 120 has a first outer surface portion 120t1 and a second outer surface portion 120t2. The first outer surface portion 120t1 of the pump 120 corresponds to the first portion 110p1 of the recess 110p, and the second outer surface portion 120t2 of the pump 120 corresponds to the second portion 110p2 of the recess 110p.

In the pump 120, the first outer surface portion 120t1 is connected to the second outer surface portion 120t2. The first outer surface portion 120t1 is located on the +Z direction side with respect to the second outer surface portion 120t2. The first outer surface portion 120t1 has a substantially rectangular parallelepiped shape, and the second outer surface portion 120t2 has a substantially cylindrical shape. An outer diameter (length along the XY plane) of the first outer surface portion 120t1 is larger than an outer diameter (length along the XY plane) of the second outer surface portion 120t2.

The outer diameter (length along the XY plane) of the first outer surface portion 120t1 of the pump 120 is substantially equal to or slightly smaller than the inner diameter (length along the XY plane) of the first portion 110p1 of the recess 110p. The outer diameter (length along the XY plane) of the second outer surface portion 120t2 of the pump 120 is substantially equal to or slightly smaller than the inner diameter (length along the XY plane) of the second portion 110p2 of the recess 110p.

The thickness (length along the Z-axis direction) of the first outer surface portion 120t1 of the pump 120 is smaller than the thickness (length along the Z-axis direction) of the first portion 110p1 of the recess 110p. For example, the thickness of the first outer surface portion 120t1 of the pump 120 is less than or equal to half of the thickness of the first portion 110p1 of the recess 110p. The thickness (length along the Z-axis direction) of the second outer surface portion 120t2 of the pump 120 is substantially equal to or slightly smaller than the thickness (length along the Z-axis direction) of the second portion 110p2 of the recess 110p.

The first casing 110 includes a first component 110v, a second component 110w, and a sealing member 110U. The first component 110v has a substantially hollow box shape with one side opened (the −Z direction side in the example embodiment), and the second component 110w has a substantially plate shape. The second component 110w is disposed in close contact with the opening of the first component 110v. By arranging the second component 110w with respect to the opening of the first component 110v, the flow path 116 of the liquid feeder 100 is formed. However, the first component 110v and the second component 110w can be separated from each other. The first component 110v and the second component 110w can be separated along the XY plane.

The sealing member 110U is disposed between the first component 110v and the second component 110w. The sealing member 110U has an annular structure. The sealing member 110U has elasticity. The sealing member 110U includes an O-ring. In at least one of the first component 110v and the second component 110w, a groove corresponding to the sealing member 110U may be formed in a portion in contact with the sealing member 110U.

The sealing member 110U can suppress leakage of liquid from the space surrounded by the first component 110v and the second component 110w. The first component 110v, the second component 110w, and the sealing member 110U constitute the first casing 110.

The first component 110v has the first outer main surface 110a and most of the first outer side surface 110c to the fourth outer side surface 110f. The second component 110w has the second outer main surface 110b and parts of the first outer side surface 110c to the fourth outer side surface 110f.

The inflow port 112 is provided in the first component 110v. The inflow port 112 penetrates the first component 110v. Specifically, the inflow port 112 is located on the +X direction side along the X direction of the first component 110v.

The outflow port 114 is provided in the second component 110w. The outflow port 114 penetrates the second component 110w. Specifically, the outflow port 114 is located substantially at the center of the second component 110w along the X direction. The outflow port 114 is located below the recess 110p. A groove communicating with the outflow port 114 may be formed in the second component 110w.

Figure 3A:
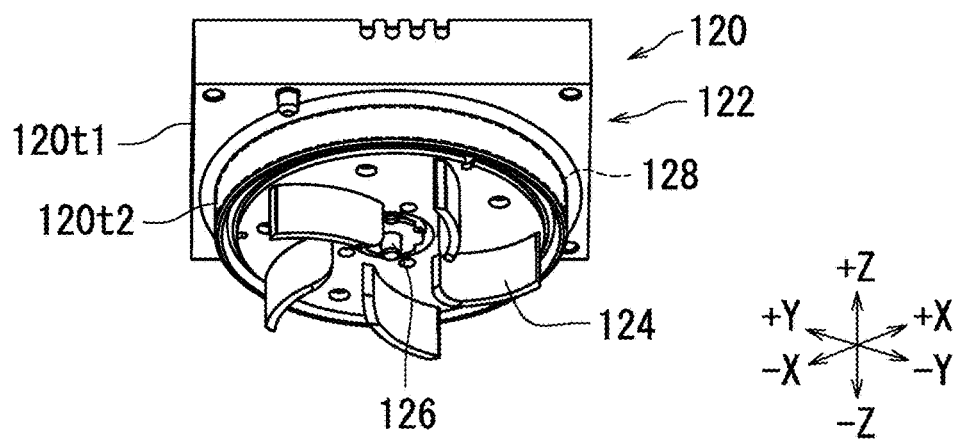
FIG. 3A is a schematic perspective view of a pump in the liquid feeder of the first example embodiment.
Figure 3B:
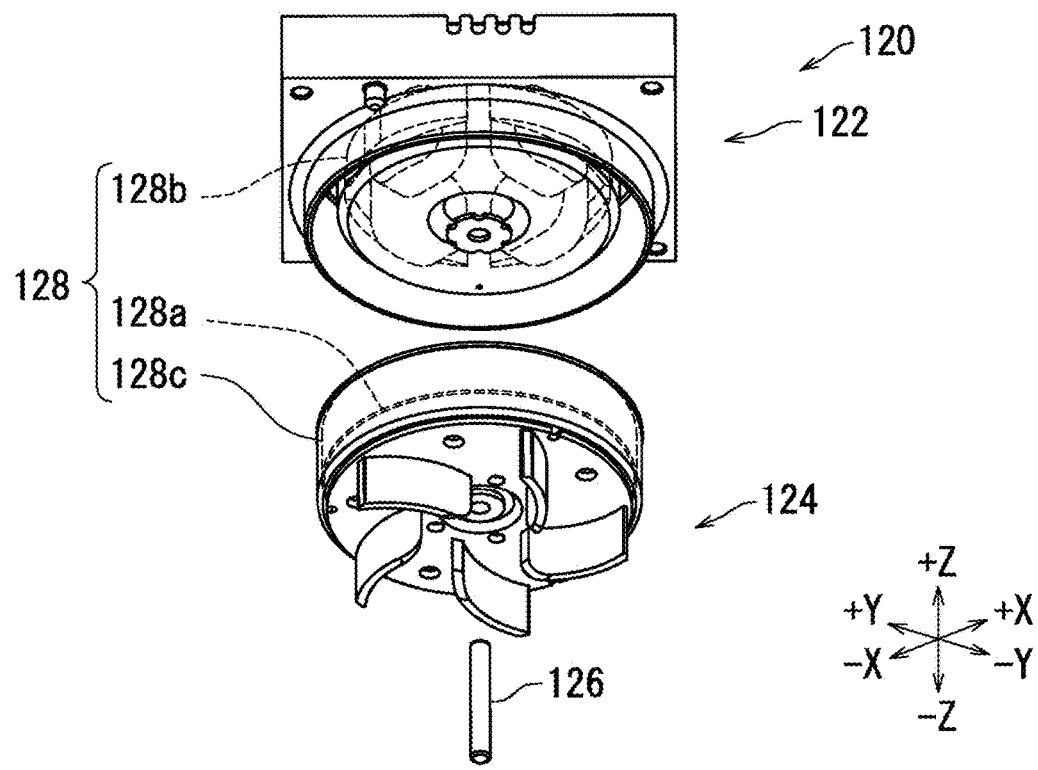
FIG. 3B is a schematic exploded perspective view of the pump in the liquid feeder of the first example embodiment.
Figure 3C:
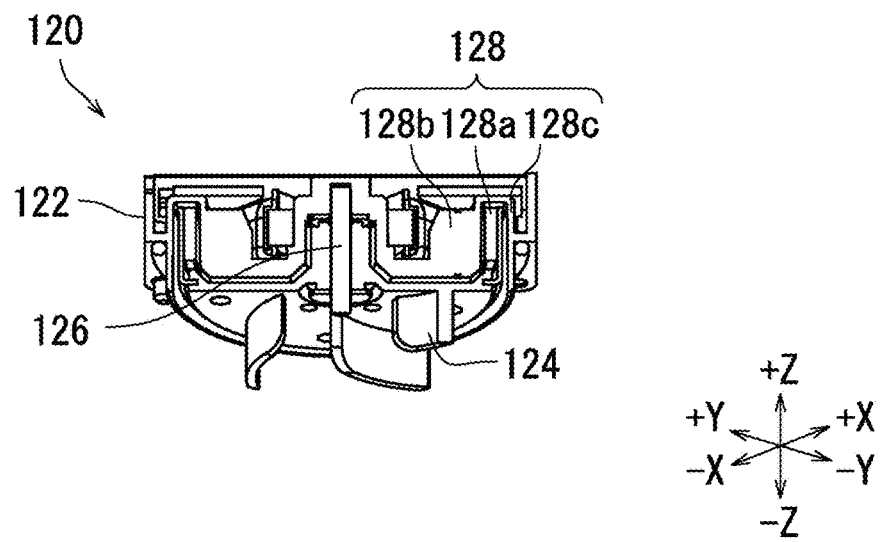
FIG. 3C is a schematic cross-section view of the pump in the liquid feeder of the first example embodiment.
Figure 3D:
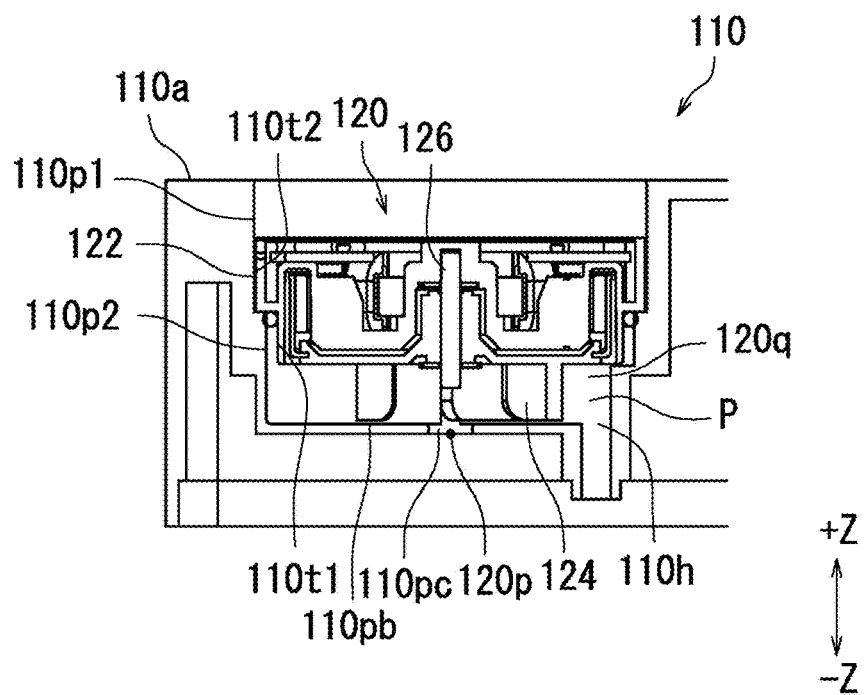
FIG. 3D is a schematic cross-sectional view of a first component in which a pump is disposed in the liquid feeder of the first example embodiment.

Next, the pump 120 in the liquid feeder 100 will be described with reference to FIGS. 1A to 3D. FIG. 3A is a schematic perspective view of the pump 120, and FIG. 3B is a schematic exploded perspective view of the pump 120. FIG. 3C is a cross-sectional perspective view of the pump 120, and FIG. 3D is a schematic cross-sectional view of the pump 120 inserted into the recess 110p of the first component 110v.

As illustrated in FIGS. 3A and 3B, the pump 120 includes a second casing 122, an impeller 124, a pump rotation shaft 126, and a motor 128. The impeller 124 is disposed in a pump chamber P described later. The pump rotation shaft 126 is attached to a shaft support portion 110ps (FIG. 4A) of the first casing 110 and the second casing 122. The impeller 124 is supported by the pump rotation shaft 126, and when the pump rotation shaft 126 rotates about the axis, the impeller 124 rotates. The motor 128 rotates the impeller 124 about the pump rotation shaft 126.

The pump 120 has a first outer surface portion 120t1 and a second outer surface portion 120t2. Specifically, the second casing 122 has the first outer surface portion 120t1 and the second outer surface portion 120t2. The first outer surface portion 120t1 is located on the +Z direction side with respect to the second outer surface portion 120t2.

As illustrated in FIGS. 3B and 3C, the motor 128 includes a rotor 128a, a stator 128b, and a yoke 128c. The rotor 128a faces the stator 128b. The yoke 128c is attached radially outward with respect to the rotor 128a. The stator 128b is an armature that generates a magnetic flux according to the drive current. The stator 128b has a substantially annular structure centered on the pump rotation shaft 126.

When the motor 128 is driven, a drive current is supplied from an external power supply to the stator 128b via a drive circuit (not illustrated). A magnetic flux is generated in the stator 128b in response to the supply of the drive current, and a circumferential torque is generated by the action of magnetic repulsion and attraction between the stator 128b and the rotor 128a. As a result, the rotor 128a starts to rotate about the pump rotation shaft 126.

The rotor 128a and the yoke 128c are attached to the impeller 124. Therefore, when the liquid flows in a pump chamber P to be described later, the rotor 128a and the yoke 128c are immersed in the liquid together with the impeller 124.

The stator 128b is disposed inside the second casing 122 and isolated from the pump chamber P. Therefore, when the liquid flows through the flow path 116, the stator 128b does not get wet with the liquid. The rotor 128a rotates according to the magnetic flux from the stator 128b. Therefore, the impeller 124 rotates with the rotation of the rotor 128a.

As illustrated in FIG. 3D, the pump 120 is inserted into the recess 110p of the first casing 110. As described above, the recess 110p of the first outer main surface 110a has the side surface 110pa and the bottom surface 110pb. The bottom surface 110pb has a normal line along the third direction (Z-axis direction). The pump rotation shaft 126 extends parallel to the third direction (Z-axis direction). When the pump 120 is inserted into the recess 110p, the pump rotation shaft 126 is disposed parallel to the normal direction of the bottom surface 110pb of the recess 110p. Therefore, the pump 120 can be stably rotated.

In the first component 110v, an opening 110pc is provided in the bottom surface 110pb of the recess 110p. The opening 110pc is located at the center of the substantially circular shape. The opening 110pc functions as the pump inlet 120p.

In the first component 110v, a through-hole 110h is provided at the boundary between the side surface 110pa and the bottom surface 110pb of the recess 110p. The through-hole 110h is located on the +X direction side and the −Y direction side on the bottom surface 110pb of the recess 110p. The through-hole 110h functions as the pump outlet 120q.

By attaching the pump 120 to the recess 110p of the first casing 110, the pump chamber P is formed between the first casing 110 and the second casing 122 of the pump 120. The pump chamber P is located between the first casing 110 and the second casing 122. The impeller 124 is housed in the pump chamber P.

In the pump chamber P, the pump inlet 120p and the pump outlet 120q are positioned. The pump inlet 120p is located at the center of the −Z direction-side surface of the pump chamber P. The pump outlet 120q is located on the side surfaces on the +X direction side and the −Y direction side of the pump chamber P. Liquid flows into the pump chamber P from the pump inlet 120p of the first casing 110. By the rotation of the impeller 124, the liquid in the pump chamber P is pushed out and flows out from the pump outlet 120q of the first casing 110.

In this manner, the impeller 124 is housed in the pump chamber P located between the first casing 110 and the second casing 122. Therefore, the motor 128 can circulate the liquid by rotating the impeller 124.

Figure 4A:
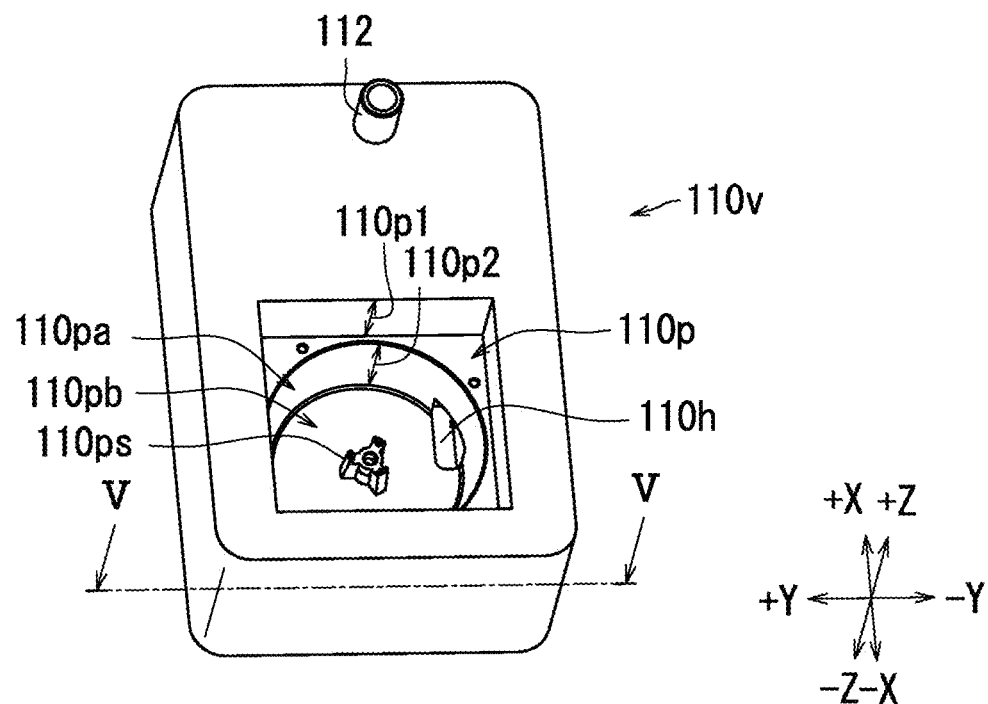
FIG. 4A is a schematic perspective view of the first component of a first casing in the liquid feeder of the first example embodiment as viewed from a +Z direction side.
Figure 4B:
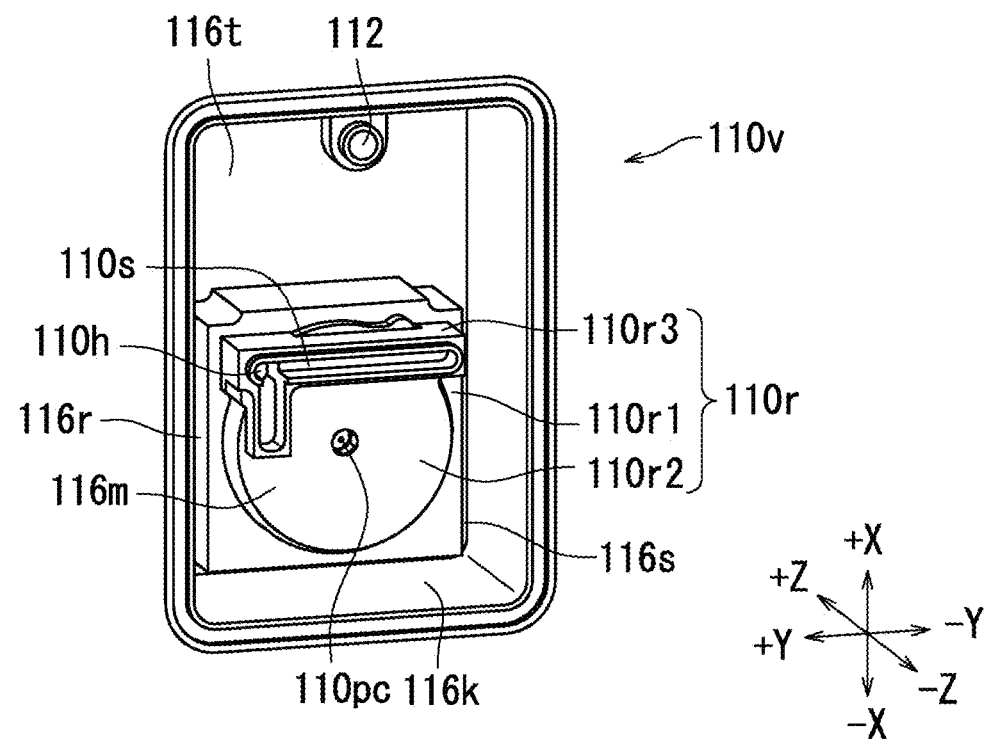
FIG. 4B is a schematic perspective view of the first component of the first casing in the liquid feeder of the first example embodiment as viewed from a −Z direction side.
Figure 5:
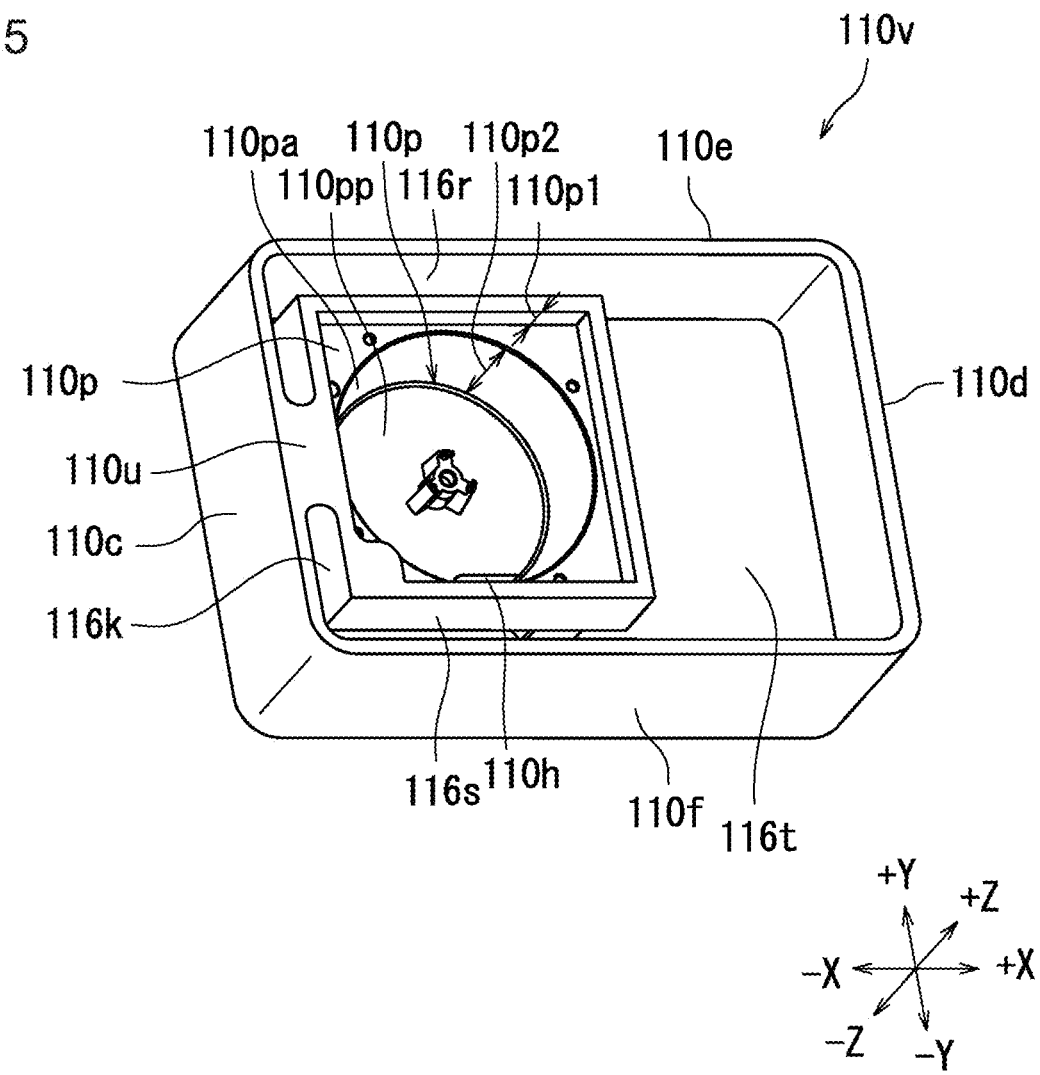
FIG. 5 is a schematic cross-sectional perspective view of the first component of the first casing in the liquid feeder of the first example embodiment.

Next, the first component 110v in the liquid feeder 100 will be described with reference to FIGS. 1 to 5. FIG. 4A is a schematic perspective view of the first component 110v mainly viewed from the +Z direction side to the −Z direction side. FIG. 4B is a schematic perspective view of the first component 110v mainly viewed from the −Z direction side to the +Z direction side. FIG. 5 is a schematic cross-sectional perspective view of the first component 110v cut along the XY plane.

As illustrated in FIG. 4A, the recess 110p is provided in the first outer main surface 110a of the first component 110v. The shape of the recess 110p corresponds to the shape of the pump 120.

The recess 110p has a first portion 110p1 and a second portion 110p2. The first portion 110p1 is connected to the second portion 110p2. The first portion 110p1 is located on the +Z direction side with respect to the second portion 110p2. A shaft support portion 110ps for supporting the pump rotation shaft 126 (FIGS. 3A to 3D) is provided at the center of the second portion 110p2. The shaft support portion 110ps protrudes from the bottom surface 110pb toward the +Z direction side. An opening 110pc (FIG. 4B) is located on the −Z direction side of the shaft support portion 110ps.

A through-hole 110h is provided in the bottom surface 110pb of the recess 110p. Specifically, the through-hole 110h is located in the second portion 110p2. The through-hole 110h penetrates the bottom surface 110pb of the recess 110p. The through-hole 110h is located on the +X direction side and the −Y direction side of the bottom surface 110pb of the recess 110p. The through-hole 110h allows the outside and the inside of the first component 110v to penetrate in the Z direction.

FIG. 4B shows the back surface of the first outer main surface 110a of the first component 110v. As illustrated in FIG. 4B, the first component 110v is provided with a protrusion 110r corresponding to the recess 110p. The protrusion 110r is provided on the back side of the first outer main surface 110a. The flow path 116 is formed on the back side of the first outer main surface 110a.

Specifically, the protrusion 110r has the first portion 110r1 corresponding to the first portion 110p1 of the recess 110p and the second portion 110r2 corresponding to the second portion 110p2 of the recess 110p. The first portion 110r1 is connected to the second portion 110r2. The second portion 110r2 is located on the −Z direction side with respect to the first portion 110r1. The first portion 110r1 has a substantially rectangular parallelepiped shape, and the second portion 110r2 has a substantially cylindrical shape. An outer diameter (length along the XY plane) of the first portion 110r1 is larger than an outer diameter (length along the XY plane) of the second portion 110r2.

The protrusion 110r is provided with a slit 110s. The slit 110s is provided on the back side of the first outer main surface 110a. The protrusion 110r further includes a third portion 110r3 provided with the slit 110s. The third portion 110r3 is located across the first portion 110r1 and the second portion 110r2. Specifically, the third portion 110r3 is located on the +X direction side of the first portion 110r1 and the second portion 110r2.

The slit 110s is connected to the through-hole 110h. The through-hole 110h and the slit 110s constitute the downstream flow path 116q (FIG. 1B) in the flow path 116.

In the first component 110v, ends on the −Z direction side of the first outer side surface 110c to the fourth outer side surface 110f are located on the −Z direction side with respect to an end on the −Z direction side of the second portion 110r2 of the protrusion 110r. Therefore, the upstream flow path 116p has a flow path that communicates with the pump inlet 120p of the flow path 116 and faces the pump 120 on the −Z direction side. In the present specification, a flow path of the upstream flow path 116p that communicates with the pump inlet 120p and faces the pump 120 on the −Z direction side may be referred to as an intermediate flow path 116m.

As shown in FIGS. 4B and 5, the upstream flow path 116p further includes a first tank chamber 116t and a second tank chamber 116k. The first tank chamber 116t is connected to the inflow port 112. The first tank chamber 116t is located on the +X direction side with respect to the pump 120. The second tank chamber 116k is located on the −X direction side with respect to the pump 120. The volume of the first tank chamber 116t is larger than the volume of the intermediate flow path 116m. The length of the first tank chamber 116t along the X direction is larger than the length of the pump chamber P along the X direction.

The second tank chamber 116k is connected to the intermediate flow path 116m. The second tank chamber 116k communicates with the pump inlet 120p in the flow path 116. The volume of the second tank chamber 116k is larger than the volume of the intermediate flow path 116m.

The volume of the first tank chamber 116t is larger than the volume of the second tank chamber 116k. Since the volume of the first tank chamber 116t connected to the inflow port 112 is larger, even if a large amount of air flows into the flow path 116 from the inflow port 112, it is possible to suppress the air from flowing into the pump 120.

The upstream flow path 116p includes a first communication flow path 116r and a second communication flow path 116s. The first communication flow path 116r connects the first tank chamber 116t and the second tank chamber 116k on one side (+Y direction side) in the second direction. The second communication flow path 116s connects the first tank chamber 116t and the second tank chamber 116k on the other side (−Y direction side) in the second direction.

In this manner, the first tank chamber 116t and the second tank chamber 116k are connected via the first communication flow path 116r and the second communication flow path 116s. Therefore, even if the posture of the liquid feeder 100 suddenly changes, the liquid can smoothly flow into the flow path 116.

As illustrated in FIG. 5, the recess 110p is connected to the first outer side surface 110c via the connecting portion 110u on the −X direction side. The connecting portion 110u is located on the +Z direction side of the second tank chamber 116k.

In the liquid feeder 100 of the present example embodiment, the downstream flow path 116q is formed only in a part of the first casing 110 on the −Z direction side with respect to the pump 120, and the upstream flow path 116p occupies most of the first casing 110. Therefore, even if the posture of the liquid feeder 100 changes, the pump 120 can be immersed in the liquid, and idling of the pump 120 can be suppressed.

Next, the upstream flow path 116p (FIG. 1B) in the liquid feeder 100 will be described with reference to FIGS. 6A to 6C. When the pump inlet 120p is used as a reference, the upstream flow path 116p can be divided into a first flow path 116a, a second flow path 116b, a third flow path 116c, a fourth flow path 116d, a fifth flow path 116e, and a sixth flow path 116f.

Figure 6A:
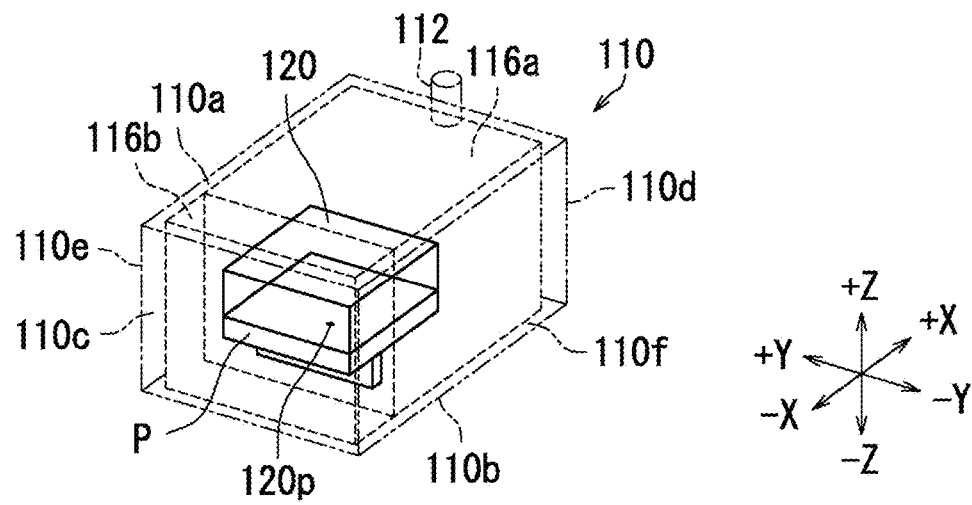
FIG. 6A is a schematic diagram showing a first flow path and a second flow path of an upstream flow path of the first casing in the liquid feeder of the first example embodiment.

As illustrated in FIG. 6A, the first flow path 116a is a portion of the upstream flow path 116p, located on the +X direction side with respect to the pump inlet 120p. The second flow path 116b is a portion of the upstream flow path 116p, located on the −X direction side with respect to the pump inlet 120p.

An end on one side (+X direction side) in the first direction of the first flow path 116a is located on one side (+X direction side) in the first direction with respect to an end on one side (+X direction side) in the first direction of the pump chamber P. An end on the other side (−X direction side) in the first direction of the second flow path 116b is located on the other side (−X direction side) in the first direction with respect to the end on the other side (−X direction side) in the first direction of the pump chamber P.

Figure 6B:
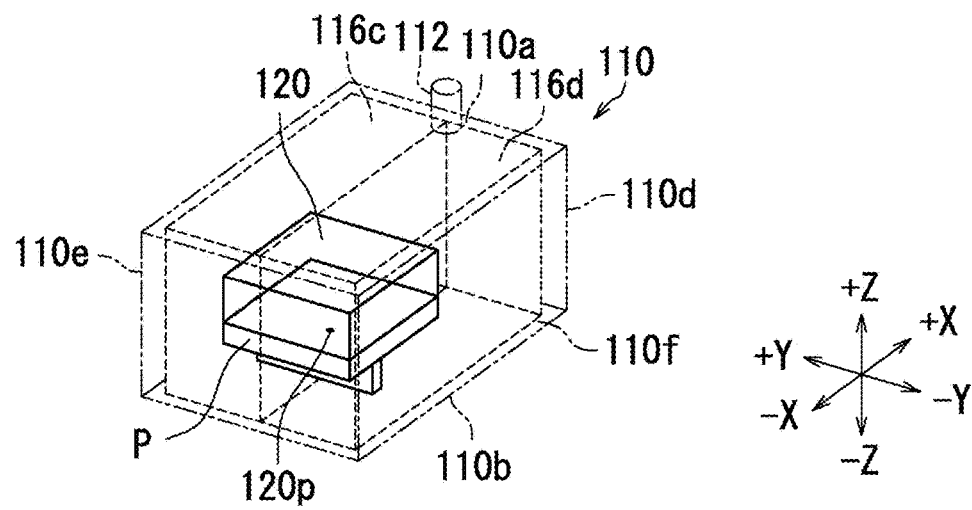
FIG. 6B is a schematic diagram showing a third flow path and a fourth flow path of the upstream flow path of the first casing in the liquid feeder of the first example embodiment.

As shown in FIG. 6B, the third flow path 116c is a portion of the upstream flow path 116p located on the +Y direction side with respect to the pump inlet 120p. The fourth flow path 116d is a portion of the upstream flow path 116p, located on the −Y direction side with respect to the pump inlet 120p.

An end on one side (+Y direction side) in the second direction of the third flow path 116c is located on one side (+Y direction side) in the second direction with respect to an end on one side (+Y direction side) in the second direction of the pump chamber P. An end on the other side (−Y direction side) in the second direction of the fourth flow path 116d is located on the other side (−Y direction side) in the second direction with respect to the end on the other side (−Y direction side) in the second direction of the pump chamber P.

Figure 6C:
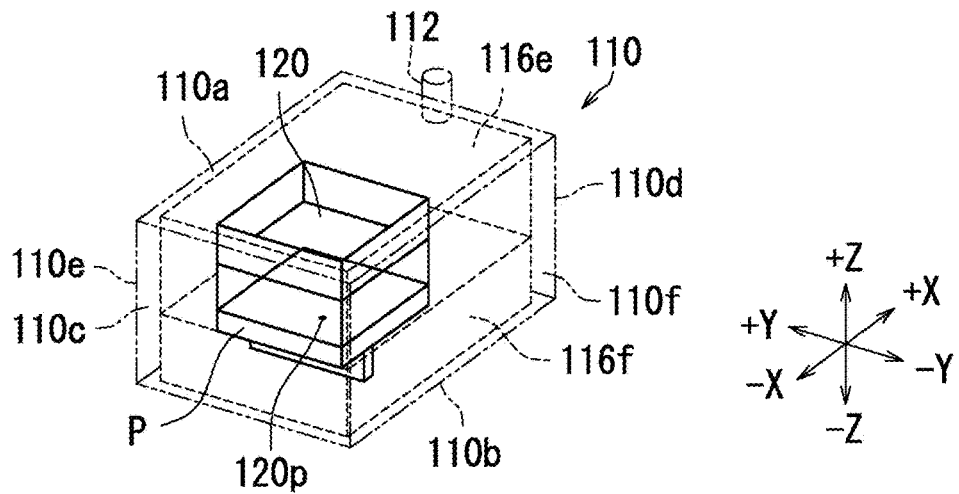
FIG. 6C is a schematic diagram showing a fifth flow path and a sixth flow path of the upstream flow path of the first casing in the liquid feeder of the first example embodiment.

As shown in FIG. 6C, the fifth flow path 116e is a portion of the upstream flow path 116p, located on the +Z direction side with respect to the pump inlet 120p. The sixth flow path 116f is a portion of the upstream flow path 116p, located on the −Z direction side with respect to the pump inlet 120p.

An end on one side (+Z direction side) in the third direction of the fifth flow path 116e is located on one side (+Z direction side) in the third direction with respect to an end on one side (+Z direction side) in the third direction of the pump chamber P. An end on the other side (−Z direction side) in the third direction of the sixth flow path 116f is located on the other side (−Z direction side) in the third direction with respect to an end on the other side (−Z direction side) in the third direction of the pump chamber P. As described above, it is possible to suppress accumulation of air in the pump chamber P regardless of the posture of the liquid feeder 100.

As described above, the upstream flow path 116p includes the first flow path 116a located on one side (+X direction side) in the first direction with respect to the pump inlet 120p, the second flow path 116b located on the other side (−X direction side) in the first direction with respect to the pump inlet 120p, the third flow path 116c located on one side (+Y direction side) in the second direction orthogonal to the first direction with respect to the pump inlet 120p, the fourth flow path 116d located on the other side (−Y direction side) in the second direction with respect to the pump inlet 120p, the fifth flow path 116e located on one side (+Z direction side) in the third direction orthogonal to the first direction and the second direction with respect to the pump inlet 120p, and the sixth flow path 120f located on the other side (−Z direction side) in the third direction with respect to the pump inlet 116p. Therefore, regardless of the posture of the liquid feeder 100, it is possible to suppress air from flowing into the pump 120 and to suppress idling of the pump 120.

The ends of the first flow path 116a to the sixth flow path 116f are located farther than the corresponding ends of the pump chamber P. Therefore, it is possible to suppress accumulation of air in the pump chamber P regardless of the posture of the liquid feeder 100.

Next, the upstream flow path 116p (FIG. 1B) in the liquid feeder 100 will be described with reference to FIGS. 1A to 7C. When pump chamber P is used as a reference, the upstream flow path 116p can be divided into the first tank chamber 116t, the second tank chamber 116k, a first communication flow path 116r, a second communication flow path 116s, a third communication flow path 116u, and a fourth communication flow path 116w.

Figure 7A:
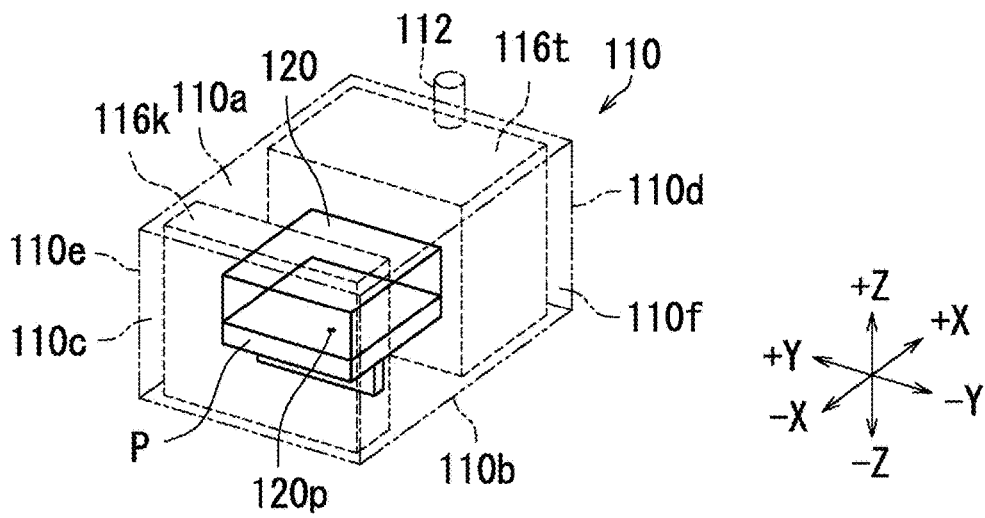
FIG. 7A is a schematic diagram showing a first tank chamber and a second tank chamber in the upstream flow path of the first casing in the liquid feeder of the first example embodiment.

As illustrated in FIG. 7A, the first tank chamber 116t is located on the +X direction side with respect to the pump chamber P in the upstream flow path 116p. The second tank chamber 116k is located on the −X direction side with respect to the pump chamber P in the upstream flow path 116p.

The lengths of the first tank chamber 116t and the second tank chamber 116k along the Y direction are larger than the length of the pump chamber P along the Y direction. The lengths of the first tank chamber 116t and the second tank chamber 116k along the Z direction are larger than the length of the pump chamber P along the Z direction.

As described above, the first tank chamber 116t is connected to the inflow port 112. The first tank chamber 116t includes at least a part of the first flow path 116a, at least a part of the third flow path 116c, at least a part of the fourth flow path 116d, at least a part of the fifth flow path 116e, and at least a part of the sixth flow path 116f. The first tank chamber 116t connected to the inflow port 112 can suppress the air from flowing into the pump 120 even if the air flows into the flow path 116 from the inflow port 112.

As described above, the second tank chamber 116k is located on the side opposite to the first tank chamber 116t with respect to the pump chamber P. The second tank chamber 116k includes at least a part of the second flow path 116b, at least a part of the third flow path 116c, at least a part of the fourth flow path 116d, at least a part of the fifth flow path 116e, and at least a part of the sixth flow path 116f. The second tank chamber 116k can suppress the air from flowing into the pump 120 even if the posture of the liquid feeder 100 changes.

Figure 7B:
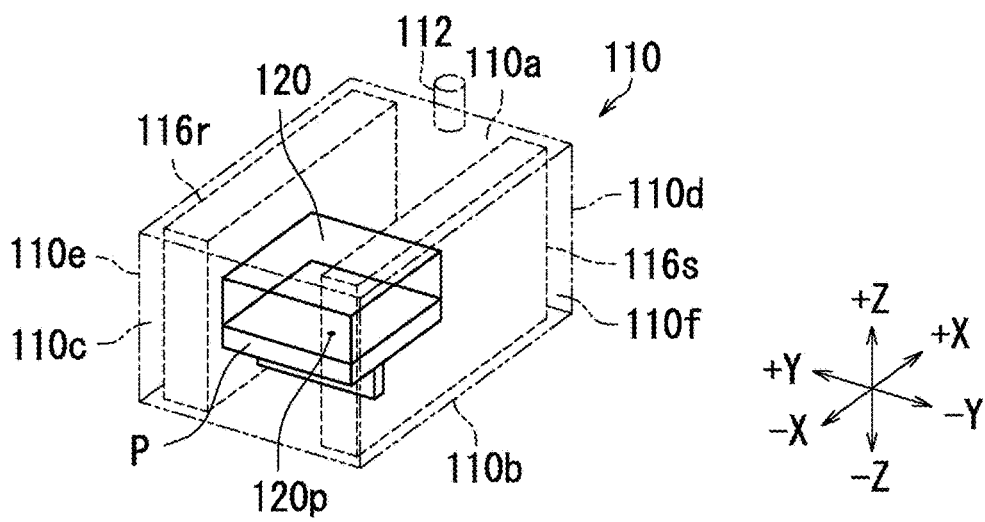
FIG. 7B is a schematic diagram showing a first communication flow path and a second communication flow path of the upstream flow path of the first casing in the liquid feeder of the first example embodiment.

As illustrated in FIG. 7B, the first communication flow path 116r is located on the +Y direction side with respect to the pump chamber P in the upstream flow path 116p. The second communication flow path 116s is located on the −Y direction side with respect to the pump chamber P in the upstream flow path 116p.

The lengths of the first communication flow path 116r and the second communication flow path 116s along the X direction are larger than the length of the pump chamber P along the X direction. The lengths of the first communication flow path 116r and the second communication flow path 116s along the Z direction are larger than the length of the pump chamber P along the Z direction.

Figure 7C:
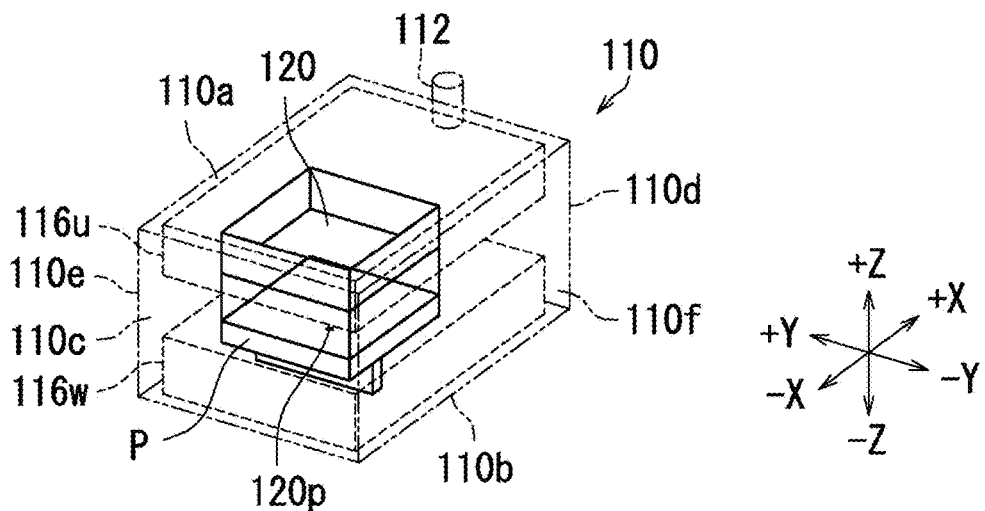
FIG. 7C is a schematic diagram illustrating a third communication flow path and a fourth communication flow path of the upstream flow path of the first casing in the liquid feeder of the first example embodiment.

As shown in FIG. 7C, the third communication flow path 116u is located on the +Z direction side with respect to the pump chamber P in the upstream flow path 116p. The fourth communication flow path 116w is located on the −Z direction side with respect to the pump chamber P in the upstream flow path 116p. The length of the third communication flow path 116u along the Z direction is larger than the length of the pump chamber P along the Z direction. The length of the fourth communication flow path 116w along the Z direction is larger than the length of the pump chamber P along the Z direction.

The lengths of the third communication flow path 116u and the fourth communication flow path 116w along the X direction are larger than the length of the pump chamber P along the X direction. The lengths of the third communication flow path 116u and the fourth communication flow path 116w along the Y direction are larger than the length of the pump chamber P along the Y direction.

Figure 8A:
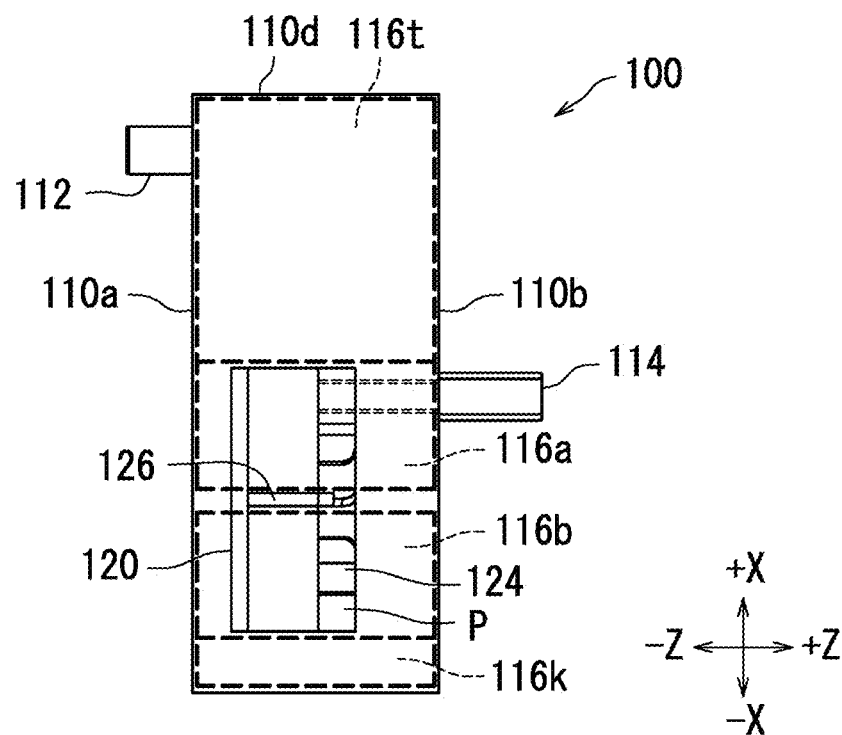
FIG. 8A is a schematic diagram of the liquid feeder of the first example embodiment in which a second outer side surface faces vertically upward.
Figure 8B:
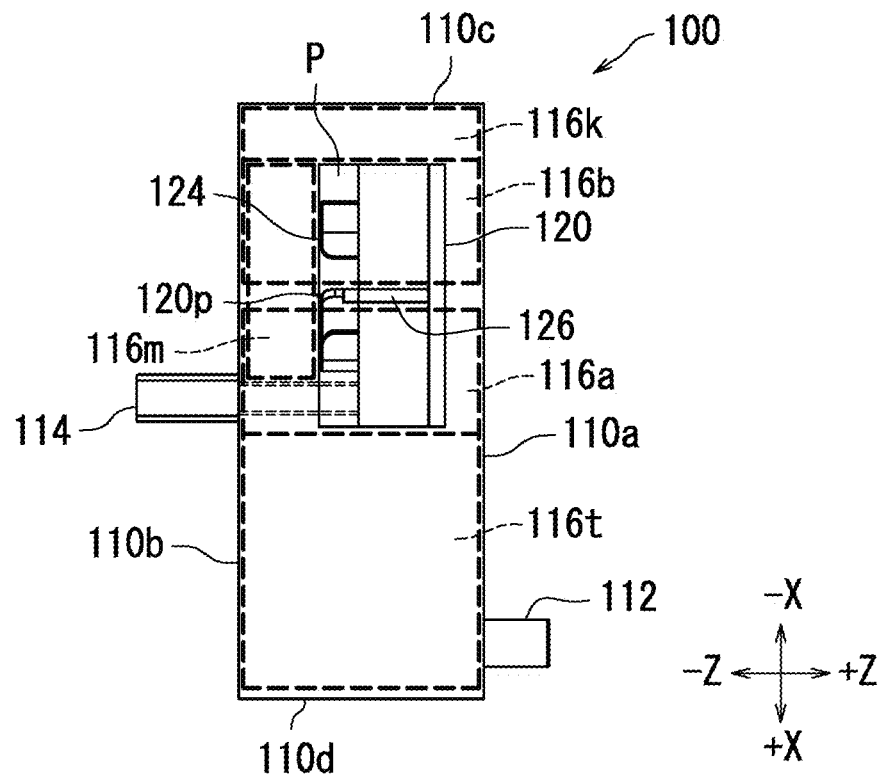
FIG. 8B is a schematic diagram of the liquid feeder of the first example embodiment in which a first outer side surface faces vertically upward.
Figure 9A:
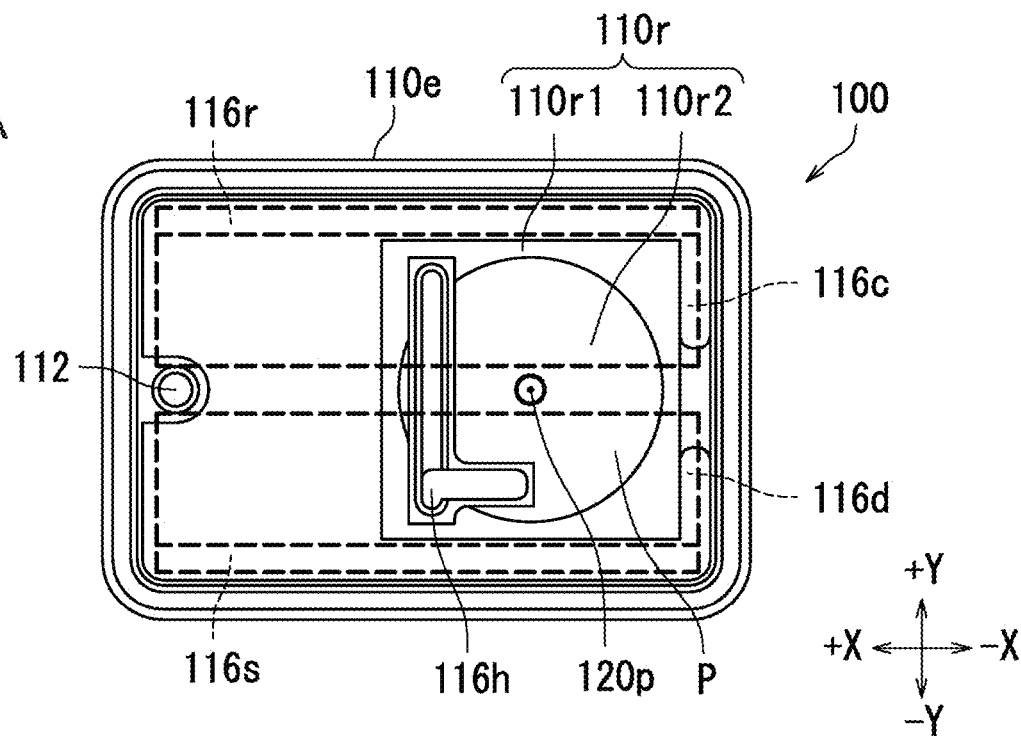
FIG. 9A is a schematic diagram of the liquid feeder of the first example embodiment in which a third outer side surface faces vertically upward.
Figure 9B:
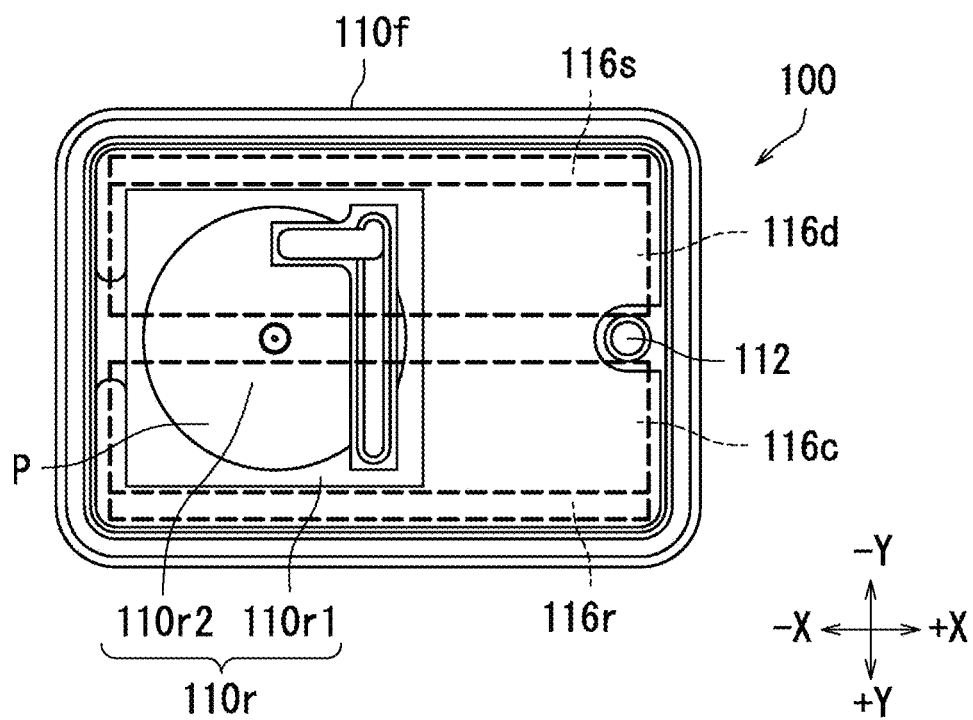
FIG. 9B is a schematic diagram of the liquid feeder of the first example embodiment in which a fourth outer side surface faces vertically upward.
Figure 10A:
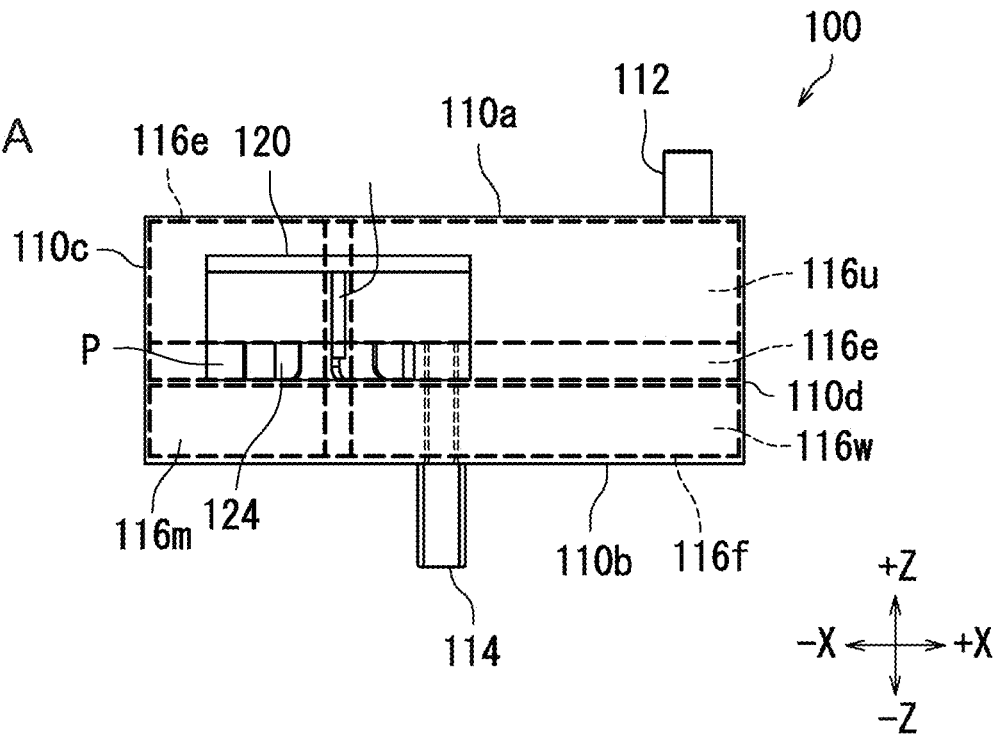
FIG. 10A is a schematic diagram of the liquid feeder of the first example embodiment in which a first outer main surface faces vertically upward.
Figure 10B:
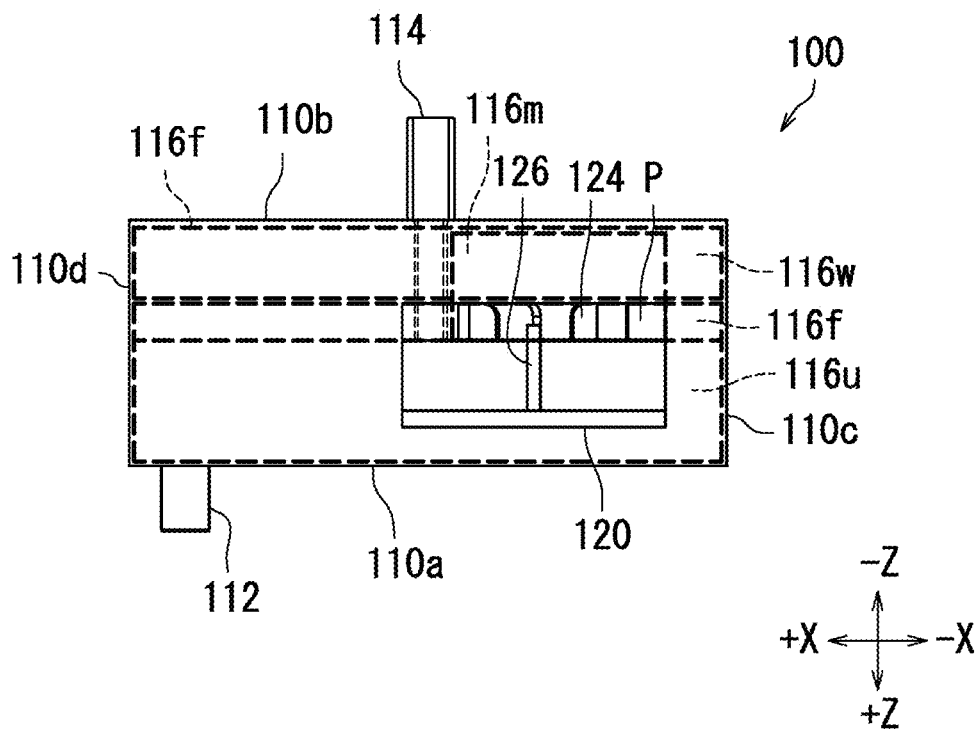
FIG. 10B is a schematic diagram of the liquid feeder of the first example embodiment in which a second outer main surface faces vertically upward.

Next, the liquid feeder 100 will be described with reference to FIGS. 8A to 10B. In FIGS. 8A to 10B, the liquid feeder 100 shows different postures. FIG. 8A is a schematic diagram of the liquid feeder 100 in which the second outer side surface 110d faces vertically upward, and FIG. 8B is a schematic diagram of the liquid feeder 100 in which the first outer side surface 110c faces vertically upward. FIG. 9A is a schematic diagram of the liquid feeder 100 in which the third outer side surface 110e faces vertically upward, and FIG. 9B is a schematic diagram of the liquid feeder 100 in which the fourth outer side surface 110f faces vertically upward. FIG. 10A is a schematic diagram of the liquid feeder 100 in which the first outer main surface 110a faces vertically upward, and FIG. 10B is a schematic diagram of the liquid feeder 100 in which the second outer main surface 110b faces vertically upward.

As illustrated in FIG. 8A, when the second outer side surface 110d located on the +X direction side in the liquid feeder 100 faces vertically upward, the first flow path 116a of the flow path 116 is located above the pump chamber P. Therefore, even if the air bubbles flow into the flow path 116 of the first casing 110 of the liquid feeder 100 in a state where the second outer side surface 110d faces vertically upward, the air bubbles that have flowed in accumulate in the first flow path 116a. Therefore, air bubbles can be suppressed from flowing into the pump inlet 120p, and as a result, idling of the pump 120 can be suppressed.

As illustrated in FIG. 8B, the second flow path 116b of the flow path 116 is located above the pump chamber P in a state where the first outer side surface 110c located on the −X direction side in the liquid feeder 100 faces vertically upward. Therefore, even if air bubbles flow into the flow path 116 of the first casing 110 of the liquid feeder 100 in a state where the first outer side surface 110c faces vertically upward, the air bubbles that have flowed in accumulate in the second flow path 116b. Therefore, air bubbles can be suppressed from flowing into the pump inlet 120p, and as a result, idling of the pump 120 can be suppressed.

As illustrated in FIG. 9A, the third flow path 116c of the flow path 116 is located above the pump chamber P in a state where the third outer side surface 110e located on the +Y direction side in the liquid feeder 100 faces vertically upward. Therefore, even if air bubbles flow into the flow path 116 of the first casing 110 of the liquid feeder 100 in a state where the third outer side surface 110e faces vertically upward, the air bubbles that have flowed in accumulate in the third flow path 116c. Therefore, air bubbles can be suppressed from flowing into the pump inlet 120p, and as a result, idling of the pump 120 can be suppressed.

As illustrated in FIG. 9B, the fourth flow path 116d of the flow path 116 is located above the pump chamber P in a state where the fourth outer side surface 110f located on the −Y direction side in the liquid feeder 100 faces vertically upward. Therefore, even if the air bubbles flow into the flow path 116 of the first casing 110 of the liquid feeder 100 in a state where the fourth outer side surface 110f faces vertically upward, the air bubbles that have flowed in accumulate in the fourth flow path 116d. Therefore, air bubbles can be suppressed from flowing into the pump inlet 120p, and as a result, idling of the pump 120 can be suppressed.

As illustrated in FIG. 10A, the fifth flow path 116e of the flow path 116 is located above the pump chamber P in a state where the first outer main surface 110a located on the +Z direction side in the liquid feeder 100 faces vertically upward. Therefore, even if the air bubbles flow into the flow path 116 of the first casing 110 of the liquid feeder 100 in a state where the first outer main surface 110a faces vertically upward, the air bubbles that have flowed in accumulate in the fifth flow path 116e. Therefore, air bubbles can be suppressed from flowing into the pump inlet 120p, and as a result, idling of the pump 120 can be suppressed.

As illustrated in FIG. 10B, the sixth flow path 116f of the flow path 116 is located above the pump chamber P in a state where the second outer main surface 110b located on the −Z direction side in the liquid feeder 100 faces vertically upward. Therefore, even if the air bubbles flow into the flow path 116 of the first casing 110 of the liquid feeder 100 in a state where the second outer main surface 110b is directed vertically upward, the air bubbles that have flowed in accumulate in the sixth flow path 116f. Therefore, air bubbles can be suppressed from flowing into the pump inlet 120p, and as a result, idling of the pump 120 can be suppressed.

Figure 11:
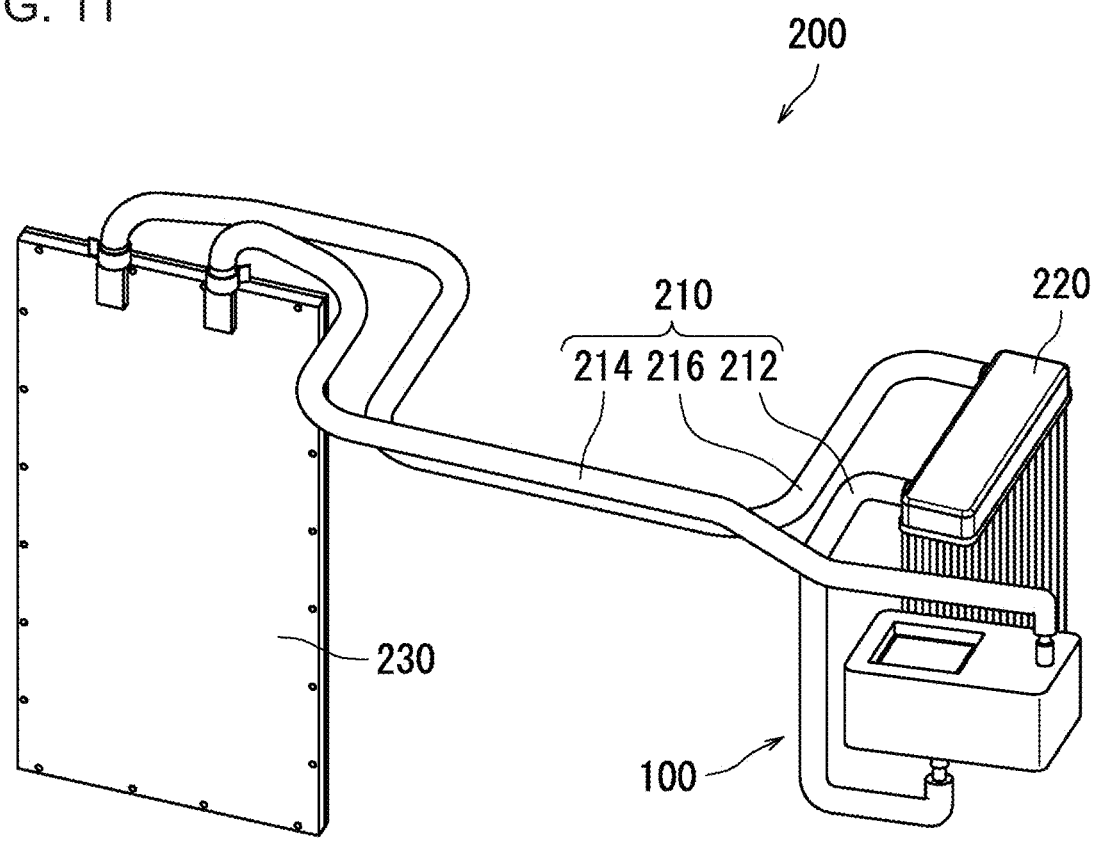
FIG. 11 is a schematic diagram of a cooler having the liquid feeder of the first example embodiment.

Next, the cooler 200 will be described with reference to FIG. 11. FIG. 11 is a schematic perspective view of the cooler 200.

As illustrated in FIG. 11, the cooler 200 includes the liquid feeder 100 of the first example embodiment, a pipe 210, a radiator 220, and a cold plate 230. The cooler 200 circulates a liquid as a refrigerant. The liquid feeder 100 sequentially feeds the liquid, so that the liquid circulates in the cooler 200.

The liquid feeder 100, the radiator 220, and the cold plate 230 are connected using the pipe 210. The liquid feeder 100 feeds the liquid supplied through the pipe 210 toward the radiator 220. The liquid fed from the liquid feeder 100 flows to the radiator 220 through the pipe 210. The radiator 220 releases the heat of the liquid flowing through the pipe 210 to the outside, so that the liquid in the pipe 210 is cooled.

The pipe 210 has a tubular shape. For example, the pipe 210 is made of resin. In one example, the pipe 210 is a rubber tube.

The cold plate 230 is typically disposed near a heat source. For example, the cold plate 230 is disposed opposite to the heat source. Alternatively, the cold plate 230 may be disposed in contact with the heat source. When the liquid cooled in the radiator 220 flows to the cold plate 230, the heat of the heat source is transferred through the cold plate 230 and absorbed by the liquid inside the cold plate 230. After that, the liquid having passed through the cold plate 230 returns to the liquid feeder 100 and is fed again to the pipe 210.

The pipe 210 includes an inflow pipe 212, an outflow pipe 214, and a communication pipe 216. The inflow pipe 212 is connected to the inflow port 112 of the liquid feeder 100. The inflow pipe 212 connects the cold plate 230 and the inflow port 112 of the liquid feeder 100. The liquid having absorbed the heat in the cold plate 230 flows toward the liquid feeder 100 through the pipe 212.

The outflow pipe 214 is connected to the outflow port 114 of the liquid feeder 100. The outflow pipe 214 connects the liquid feeder 100 and the radiator 220. The liquid fed from the liquid feeder 100 flows toward the radiator 220 through the outflow pipe 214. The radiator 220 releases the heat of the liquid. Thus, the radiator 220 cools the liquid.

The communication pipe 216 connects the radiator 220 and the cold plate 230. The liquid cooled in the radiator 220 flows toward the cold plate 230 through the communication pipe 216. The liquid absorbs the heat from the heat source in the cold plate 230. The liquid having absorbed the heat in the cold plate 230 flows toward the liquid feeder 100 through the pipe 212. Thereafter, the liquid is fed again in the liquid feeder 100, and circulates through the outflow pipe 214, the radiator 220, the communication pipe 216, the cold plate 230, and the inflow pipe 212.

In the above description with reference to FIG. 11, the liquid feeder 100 according to the first example embodiment supplies liquid to the cold plate 230, but the present example embodiment is not limited thereto. The cold plate may be disposed in the liquid feeder.

Next, a liquid feeder 100 of a second example embodiment will be described with reference to FIGS. 12A to 18.

The liquid feeder 100 of the second example embodiment is different from the liquid feeder 100 of the first example embodiment in that the outflow port 114 is provided to the first outer main surface 110a, and the liquid feeder 100 further includes a cold plate 130, a partition plate 140, and an elastic member 150. In the liquid feeder 100 of the second example embodiment, description overlapping with the liquid feeder 100 of the first example embodiment is omitted to avoid redundancy.

Figure 12A:
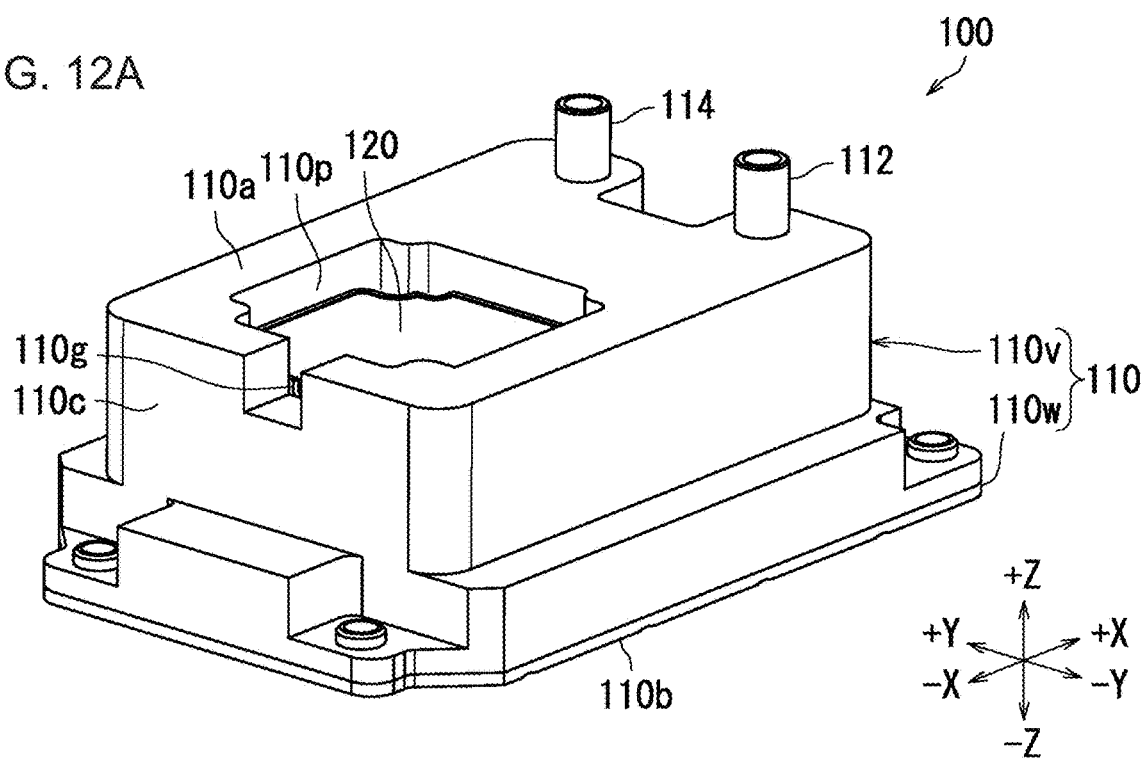
FIG. 12A is a schematic perspective view of a liquid feeder of a second example embodiment of the present invention.
Figure 12B:
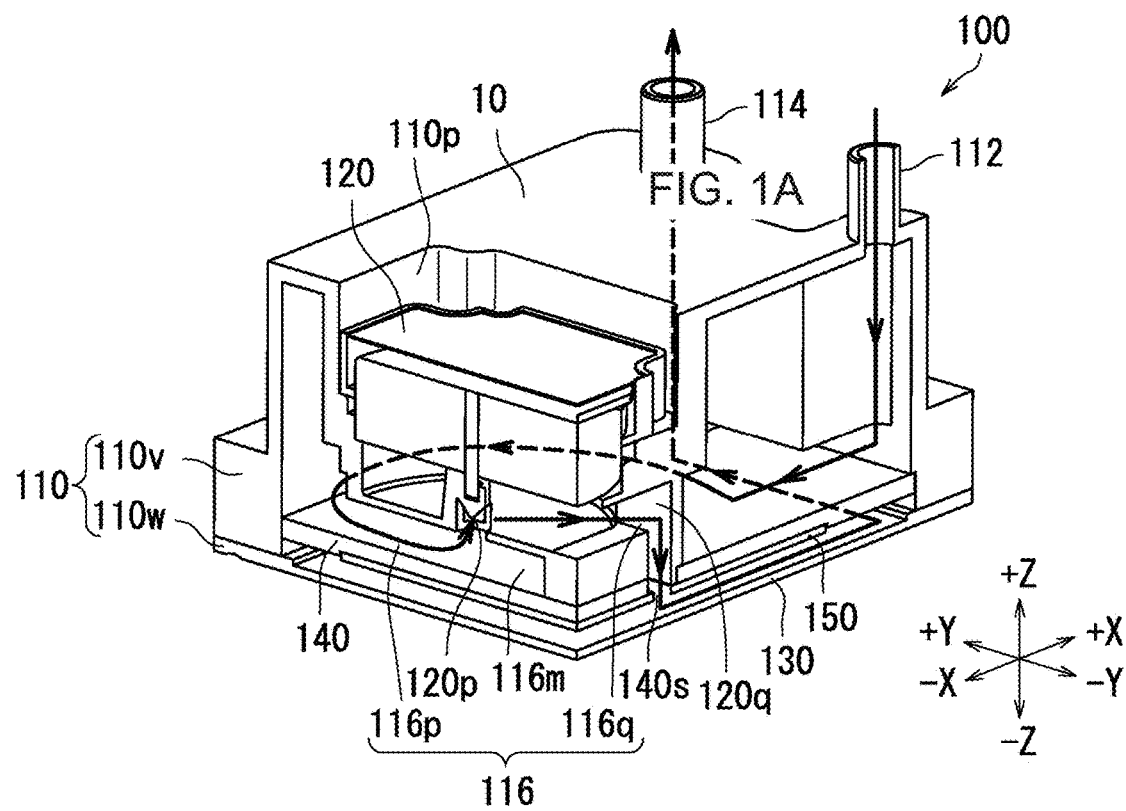
FIG. 12B is a schematic partial perspective view of the liquid feeder of the second example embodiment.

FIG. 12A is a schematic perspective view of the liquid feeder 100, and FIG. 12B is a schematic partial perspective view of the liquid feeder 100. The liquid feeder 100 of the second example embodiment is used for cooling a heat generating component.

Typically, the liquid feeder 100 is attached to a heat generating component. The liquid flowing into the liquid feeder 100 absorbs the heat of the heat generating component. Thereafter, the liquid flows out from the liquid feeder 100 to the outside. The heat of the heat generating component can be absorbed by the liquid feeder 100.

In FIGS. 12A and 12B, the +Z axis side of the liquid feeder 100 faces vertically upward, but the +Z axis side of the liquid feeder 100 may not face vertically upward. Regarding the orientation of the liquid feeder 100, a surface other than the +Z axis side may face vertically upward.

As shown in FIGS. 12A and 12B, the inflow port 112 and the outflow port 114 are provided in the first outer main surface 110a of the first casing 110. The inflow port 112 and the outflow port 114 protrude from the first outer main surface 110a toward the +Z direction side.

The liquid feeder 100 further includes a cold plate 130, a partition plate 140, and an elastic member 150 in addition to the first casing 110 and the pump 120. The cold plate 130 is disposed so as to be in contact with the heat generating component. The cold plate 130 is disposed in the first casing 110. The cold plate 130 is located on the −Z direction side of the first casing 110. The cold plate 130 is disposed in the downstream flow path 116q. For example, the cold plate 130 is attached to the second component 110w. The cold plate 130 is made of metal, for example.

When the liquid feeder 100 cools the heat generating component, the heat generating component is attached to the cold plate 130. The cold plate 130 is typically disposed near the heat generating component. For example, the cold plate 130 is disposed opposite to the heat generating component.

For example, the liquid feeder 100 may cool an electronic device provided inside with a heating element. The liquid feeder 100 may cool a circuit of an electronic device. Alternatively, the liquid feeder 100 may cool a light source or the like of an electronic device. For example, the electronic device may be any of a server, a projector, a notebook personal computer, and a two-dimensional display device.

The partition plate 140 is positioned between the pump 120 and the cold plate 130. When the partition plate 140 is attached to the first component 110v, the upstream flow path 116p in the first casing 110 is partitioned on the +Z direction side with respect to the partition plate 140. The partition plate 140 is provided with a slit 140s, and the slit 140s communicates with the pump outlet 120q. The slit 140s constitutes a part of the downstream flow path 116q.

The upstream flow path 116p has an intermediate flow path 116m as at least a part of the sixth flow path 116f at a position between the pump 120 and the partition plate 140. Therefore, even if the posture of the liquid feeder 100 changes so that the other side (−Z direction side) in the third direction is positioned vertically upward, it is possible to suppress the air from flowing into the pump 120 by the intermediate flow path 116m.

The elastic member 150 is positioned between the cold plate 130 and the partition plate 140. The elastic member 150 can buffer impact of the partition plate 140 against the cold plate 130.

Here, the inflow port 112 and the outflow port 114 are located on the first outer main surface 110a. The liquid flowing in from the inflow port 112 of the first outer main surface 110a reaches the pump 120 through the upstream flow path 116p.

The liquid sent out by the pump 120 flows out from the outflow port 114 to the outside through the downstream flow path 116q. Specifically, the liquid fed by the pump 120 passes through the partition plate 140 and the elastic member 150 and flows to the cold plate 130. The liquid flowing into the cold plate 130 absorbs heat from the heat generating component. Thereafter, the liquid flows out to the outside through the outflow port 114.

The first outer side surface 110c is provided with a groove 110g communicating with the recess 110p of the first outer main surface 110a. Therefore, the fifth flow path 116e can be provided, and the wiring for driving the pump can be easily attached.

Figure 13:
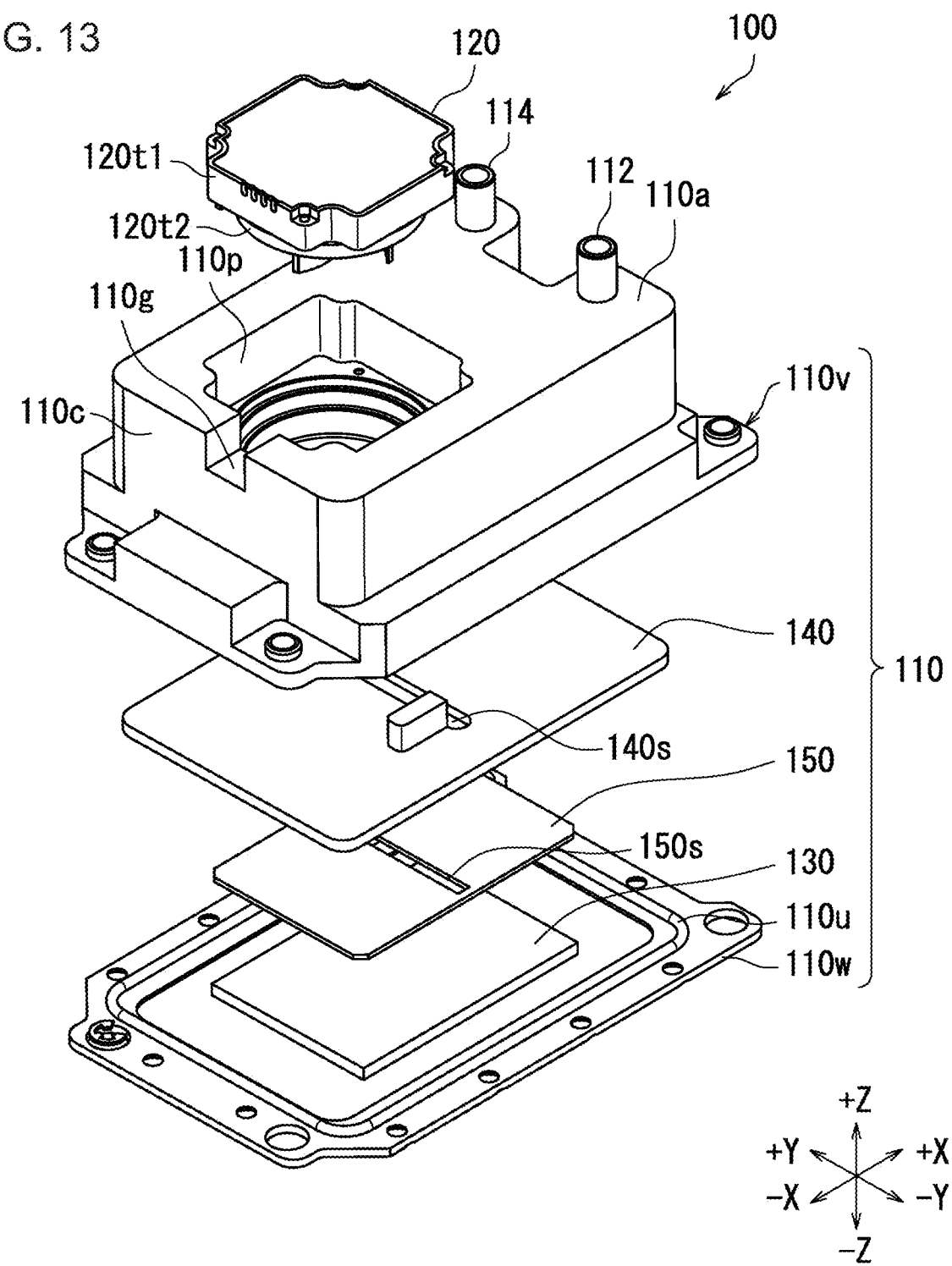
FIG. 13 is a schematic exploded perspective view of the liquid feeder of the second example embodiment.

Next, the liquid feeder 100 of the second exemplary example embodiment will be described with reference to FIGS. 12A to 13. FIG. 13 is a schematic exploded perspective view of the liquid feeder 100.

As illustrated in FIG. 13, the liquid feeder 100 includes the first casing 110, the pump 120, the cold plate 130, the partition plate 140, and the elastic member 150. The cold plate 130, the partition plate 140, and the elastic member 150 are disposed in a space formed by the first component 110v and the second component 110w.

The cold plate 130 is attached to the second component 110w. Typically, the cold plate 130 is attached to the main surface on the +Z direction side of the two main surfaces of the second component 110w, and the heat generating component is attached to the main surface on the −Z direction side. The cold plate 130 may have a fin structure.

The partition plate 140 is provided with the slit 140s. Specifically, the slit 140s is located substantially at the center along the X direction of the partition plate 140. The slit 140s extends in the Y direction.

The elastic member 150 is positioned between the cold plate 130 and the partition plate 140. The length along the X direction and the length along the Y direction of the elastic member 150 are substantially equal to the length along the X direction and the length along the Y direction of the cold plate 130, respectively. Accordingly, direct contact between the cold plate 130 and the partition plate 140 can be avoided.

The elastic member 150 is provided with a slit 150s. Specifically, the slit 150s is located substantially at the center of the elastic member 150 along the X direction. The slit 150s extends in the Y direction. The slit 140s and the slit 150s overlap each other and constitute a part of the downstream flow path 116q.

Although not illustrated in FIG. 13, the outflow port 114 extends in the −Z direction from the back surface of the first outer main surface 110a of the first component 110v. In the first component 110v, the outflow port 114 penetrates the upstream flow path 116p in the first component 110v and penetrates the partition plate 140 and the elastic member 150.

Next, the first component 110v in the liquid feeder 100 will be described with reference to FIGS. 14A and 14B. FIG.

14A is a schematic perspective view of the first component 110v as viewed from the +Z direction side to the −Z direction side. FIG. 14B is a schematic perspective view of the first component 110v as viewed from the −Z direction side to the +Z direction side.

Figure 14A:
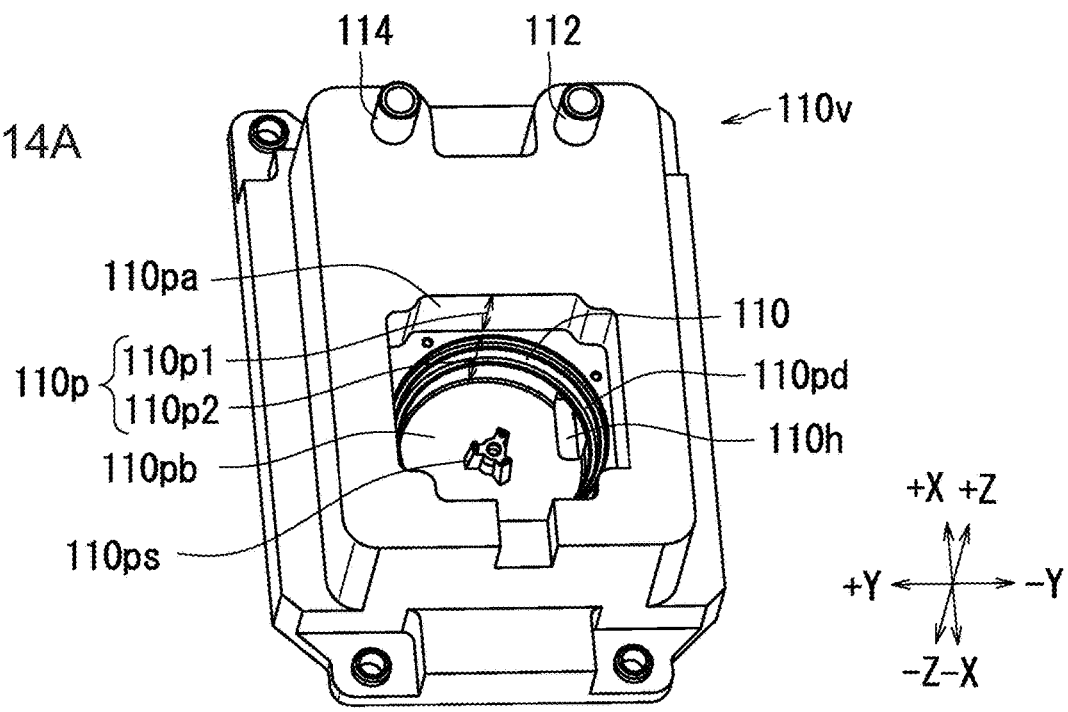
FIG. 14A is a schematic perspective view of a first portion of a first casing in the liquid feeder of the second example embodiment as viewed from a +Z direction side.

As illustrated in FIG. 14A, the first outer main surface 110a of the first component 110v is provided with the recess 110p. The recess 110p has a substantially cylindrical shape. The shape of the recess 110p corresponds to the shape of the pump 120. The recess 110p is provided with a step 110pd. Specifically, the step 110pd is provided in the second portion 110p2 of the recess 110p. In the step 110pd of the recess 110p, the inner diameter of the recess 110p decreases as the recess 110p becomes deeper (as it advances in the −Z direction).

Figure 14B:
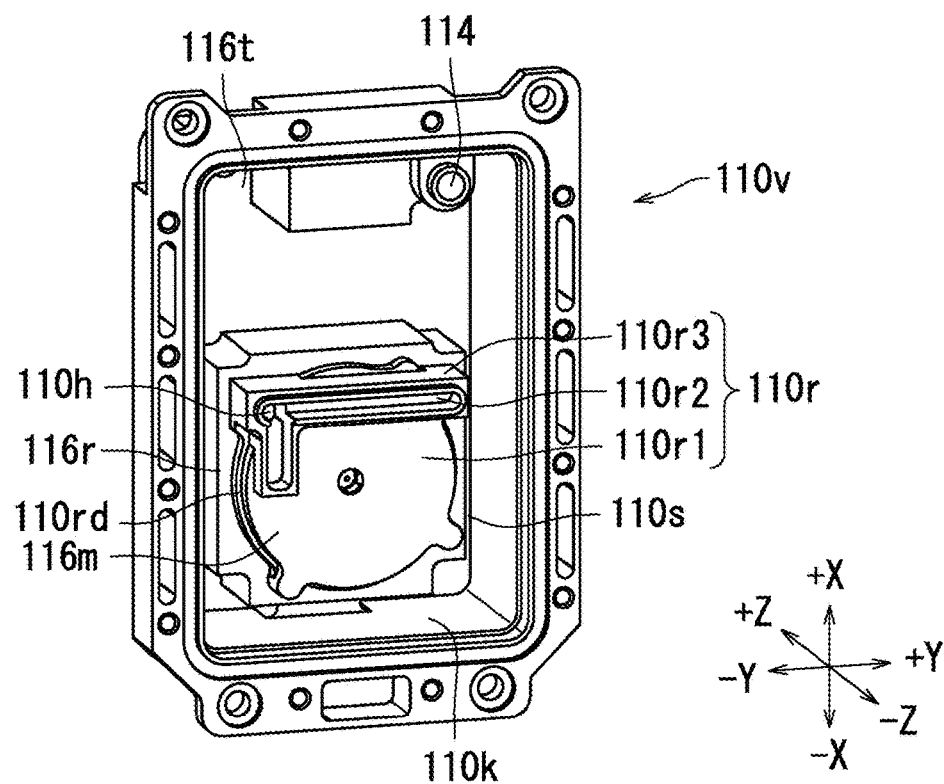
FIG. 14B is a schematic perspective view of the first portion of the first casing in the liquid feeder of the second example embodiment as viewed from a −Z direction side.

FIG. 14B shows the back surface of the first outer main surface 110a of the first component 110v. As illustrated in FIG. 14B, the first component 110v is provided with the protrusion 110r corresponding to the recess 110p. The protrusion 110r is provided on the back side of the first outer main surface 110a. The flow path 116 is formed on the back side of the first outer main surface 110a.

Specifically, the protrusion 110r has the first portion 110r1 corresponding to the first portion 110p1 of the recess 110p and the second portion 110r2 corresponding to the second portion 110p2 of the recess 110p. The first portion 110r1 is connected to the second portion 110r2. The second portion 110r2 is located on the −Z direction side with respect to the first portion 110r1. The first portion 110r1 has a substantially rectangular parallelepiped shape, and the second portion 110r2 has a substantially cylindrical shape. An outer diameter (length along the XY plane) of the first portion 110r1 is larger than an outer diameter (length along the XY plane) of the second portion 110r2.

The protrusion 110r is provided with a step 110rd. The step 110rd of the protrusion 110r corresponds to the step 110pd of the recess 110p. Specifically, the step 110rd is provided in the second portion 110r2 of the protrusion 110r. In the step 110rd of the protrusion 110r, the outer diameter of the protrusion 110r decreases as the protrusion 110r increases (as it advances in the −Z direction).

In the liquid feeder 100 of the second exemplary example embodiment, the outflow port 114 is located in the first tank chamber 116t. As described above, the outflow port 114 penetrates the partition plate 140 and extends to the second component 110w side.

Next, the liquid feeder 100 will be described with reference to FIGS. 12A to 17B. In FIGS. 15A to 17B, the liquid feeder 100 shows different postures.

Figure 15A:
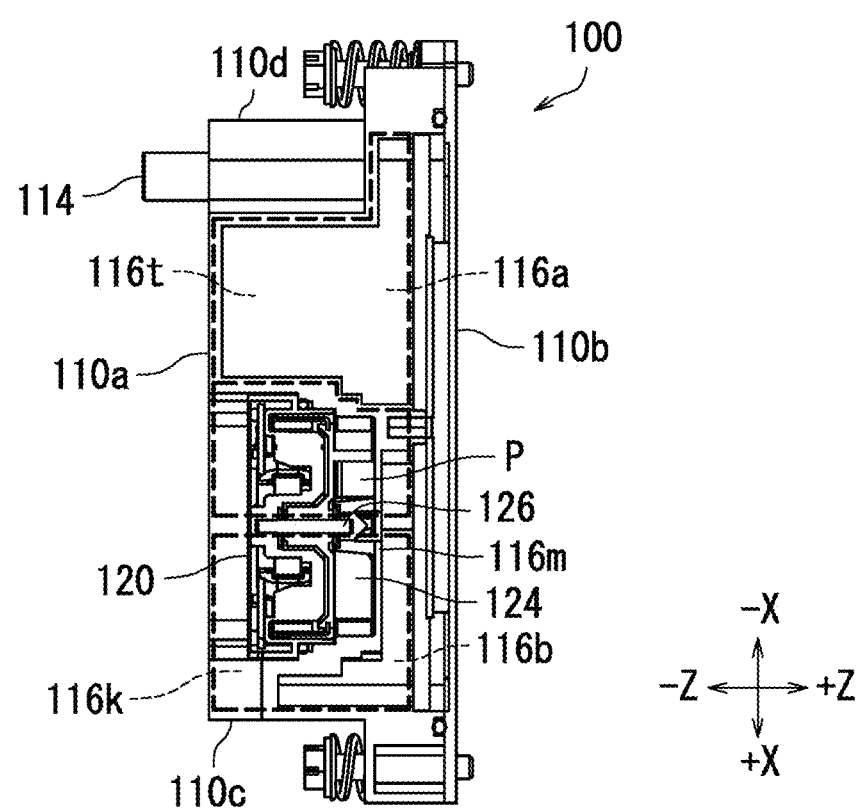
FIG. 15A is a schematic diagram of the liquid feeder of the second example embodiment in which a second outer side surface faces vertically upward.
Figure 15B:
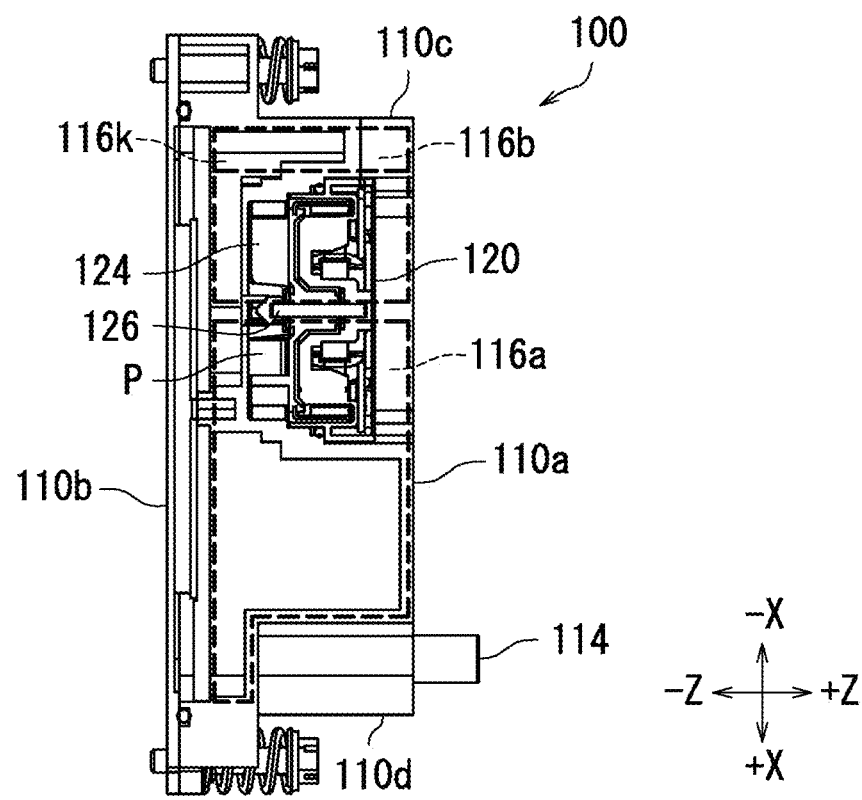
FIG. 15B is a schematic diagram of the liquid feeder of the second example embodiment in which a first outer side surface faces vertically upward.
Figure 16A:
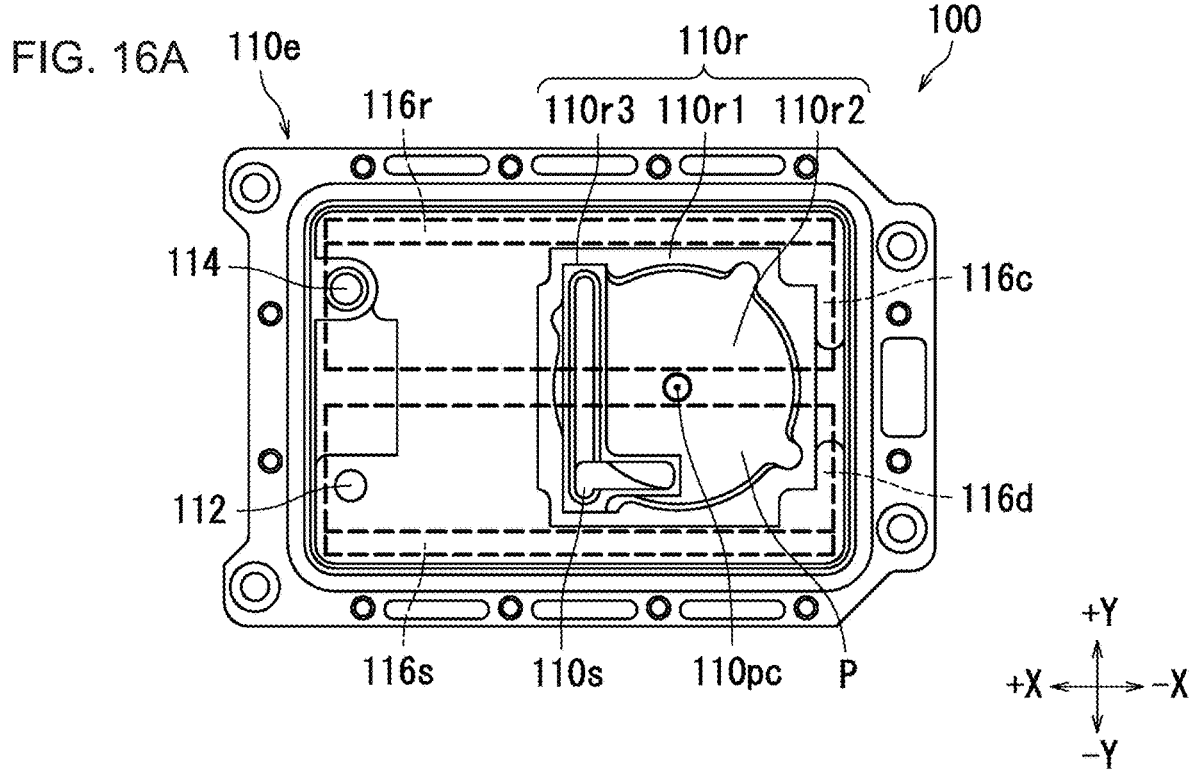
FIG. 16A is a schematic diagram of the liquid feeder of the second example embodiment in which a third outer side surface faces vertically upward.
Figure 16B:
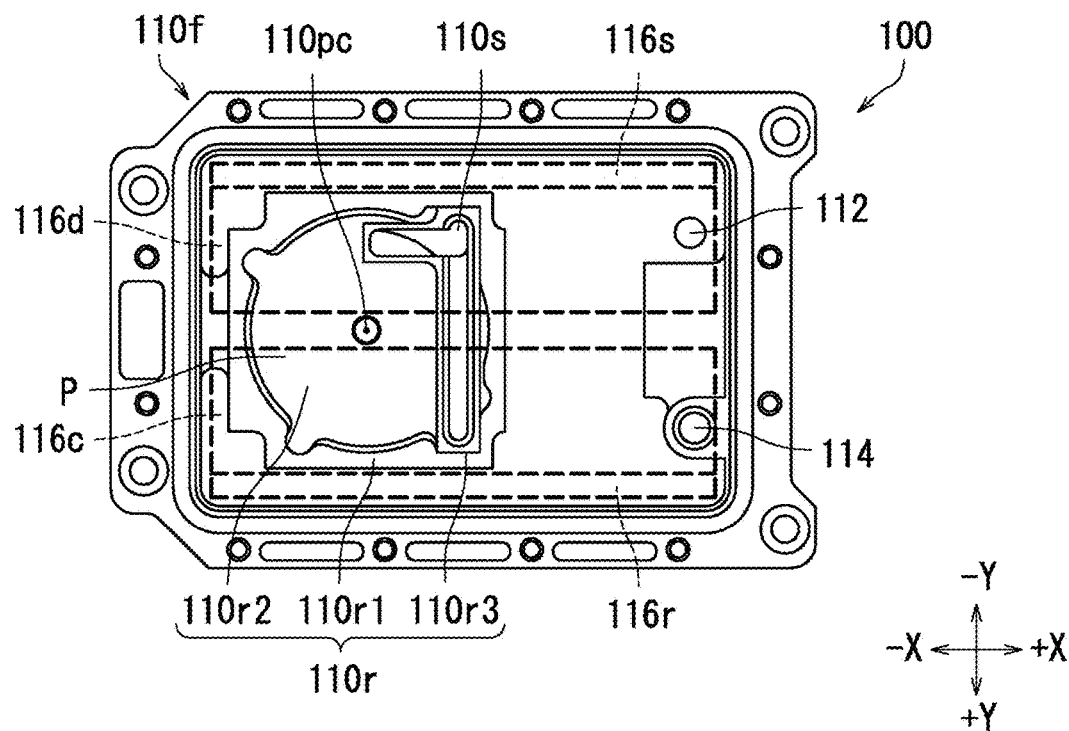
FIG. 16B is a schematic diagram of the liquid feeder of the second example embodiment in which a fourth outer side surface faces vertically upward.
Figure 17A:
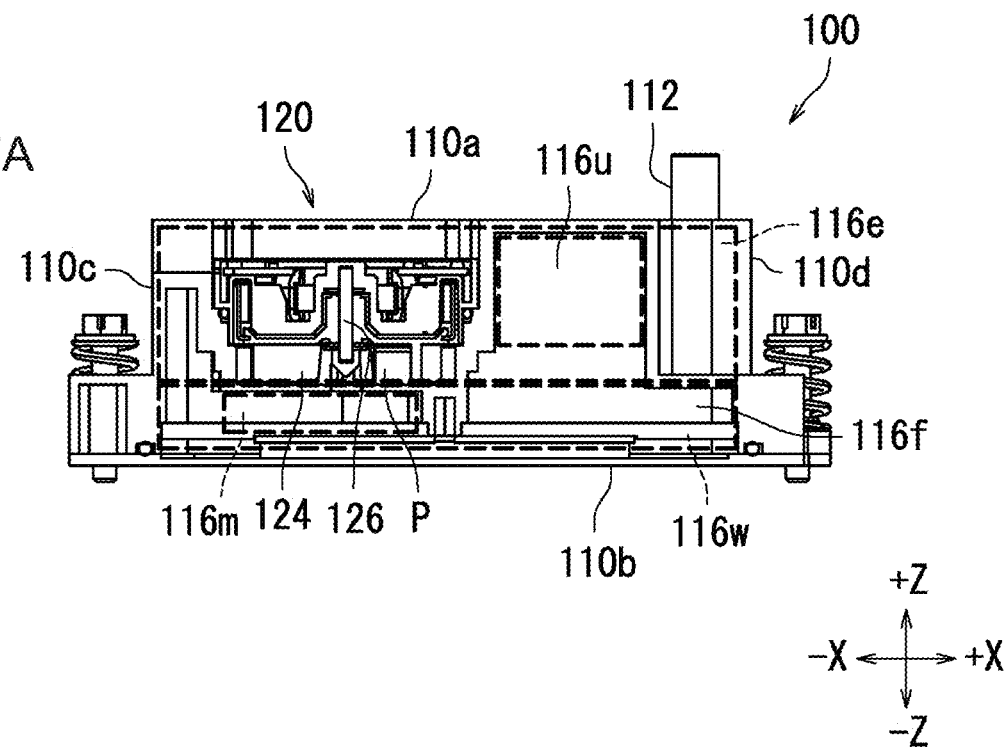
FIG. 17A is a schematic diagram of the liquid feeder of the second example embodiment in which a first outer main surface faces vertically upward.
Figure 17B:
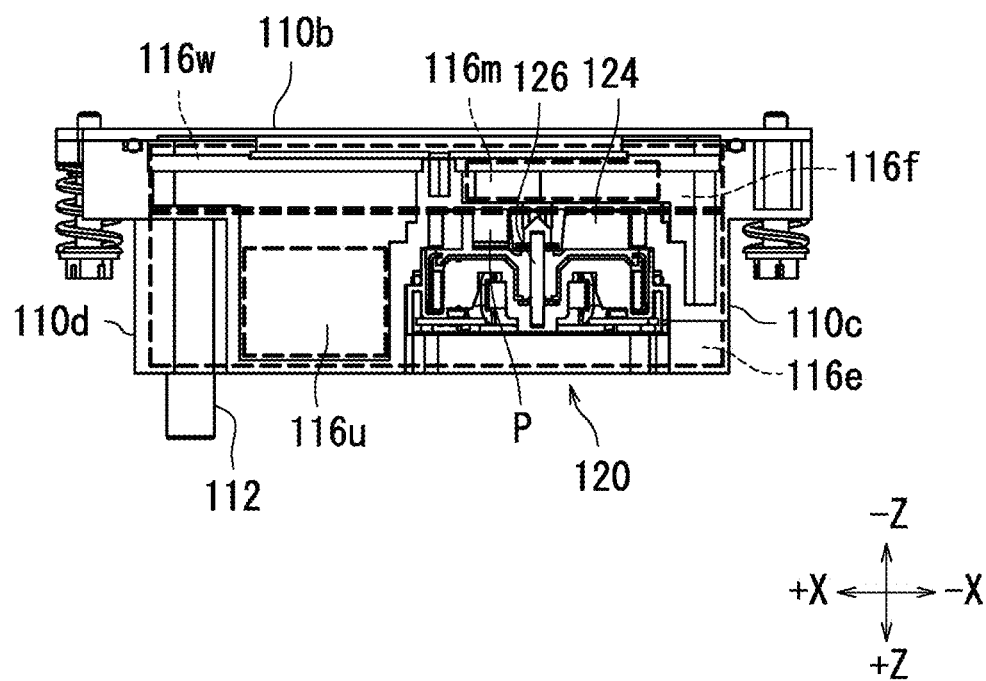
FIG. 17B is a schematic diagram of the liquid feeder of the second example embodiment in which a second outer main surface faces vertically upward.

FIG. 15A illustrates the liquid feeder 100 in which the second outer side surface 110d faces vertically upward, and FIG. 15B illustrates the liquid feeder 100 in which the first outer side surface 110c faces vertically upward. FIG. 16A illustrates the liquid feeder 100 in which the third outer side surface 110e faces vertically upward, and FIG. 16B illustrates the liquid feeder 100 in which the fourth outer side surface 110f faces vertically upward. FIG. 17A illustrates the liquid feeder 100 in which the first outer main surface 110a faces vertically upward, and FIG. 17B illustrates the liquid feeder 100 in which the second outer main surface 110b faces vertically upward.

As shown in FIG. 15A, the first flow path 116a of the flow path 116 is located above the pump chamber P in a state where the second outer side surface 110d located on the +X direction side in the liquid feeder 100 faces vertically upward. Therefore, even if the air bubbles flow into the flow path 116 of the first casing 110 of the liquid feeder 100 in a state where the second outer side surface 110d faces vertically upward, the air bubbles that have flowed in accumulate in the first flow path 116a. Therefore, air bubbles can be suppressed from flowing into the pump inlet 120p, and as a result, idling of the pump 120 can be suppressed.

As illustrated in FIG. 15B, the second flow path 116b of the flow path 116 is located above the pump chamber P in a state where the first outer side surface 110c located on the −X direction side in the liquid feeder 100 faces vertically upward. Therefore, even if air bubbles flow into the flow path 116 of the first casing 110 of the liquid feeder 100 in a state where the first outer side surface 110c faces vertically upward, the air bubbles that have flowed in accumulate in the second flow path 116b. Therefore, air bubbles can be suppressed from flowing into the pump inlet 120p, and as a result, idling of the pump 120 can be suppressed.

As shown in FIG. 16A, the third flow path 116c of the flow path 116 is located above the pump chamber P in a state where the third outer side surface 110e located on the +Y direction side in the liquid feeder 100 faces vertically upward. Therefore, even if air bubbles flow into the flow path 116 of the first casing 110 of the liquid feeder 100 in a state where the third outer side surface 110e faces vertically upward, the air bubbles that have flowed in accumulate in the third flow path 116c. Therefore, air bubbles can be suppressed from flowing into the pump inlet 120p, and as a result, idling of the pump 120 can be suppressed.

As illustrated in FIG. 16B, the fourth flow path 116d of the flow path 116 is located above the pump chamber P in a state where the fourth outer side surface 110f located on the −Y direction side in the liquid feeder 100 faces vertically upward. Therefore, even if the air bubbles flow into the flow path 116 of the first casing 110 of the liquid feeder 100 in a state where the fourth outer side surface 110f faces vertically upward, the air bubbles that have flowed in accumulate in the fourth flow path 116d. Therefore, air bubbles can be suppressed from flowing into the pump inlet 120p, and as a result, idling of the pump 120 can be suppressed.

As illustrated in FIG. 17A, the fifth flow path 116e of the flow path 116 is located above the pump chamber P in a state where the first outer main surface 110a located on the +Z direction side in the liquid feeder 100 faces vertically upward. Therefore, even if the air bubbles flow into the flow path 116 of the first casing 110 of the liquid feeder 100 in a state where the first outer main surface 110a faces vertically upward, the air bubbles that have flowed in accumulate in the fifth flow path 116e. Therefore, air bubbles can be suppressed from flowing into the pump inlet 120p, and as a result, idling of the pump 120 can be suppressed.

As illustrated in FIG. 17B, the sixth flow path 116f of the flow path 116 is located above the pump chamber P in a state where the second outer main surface 110b located on the −Z direction side in the liquid feeder 100 faces vertically upward. Therefore, even if the air bubbles flow into the flow path 116 of the first casing 110 of the liquid feeder 100 in a state where the second outer main surface 110b is directed vertically upward, the air bubbles that have flowed in accumulate in the sixth flow path 116f. Therefore, air bubbles can be suppressed from flowing into the pump inlet 120p, and as a result, idling of the pump 120 can be suppressed.

The sixth flow path 116f is located between the pump 120 and the cold plate 130. By disposing the cold plate 130 in contact with the heat generating component in the liquid feeder 100, the overall size of the cooler 200 can be reduced. Even with such a structure, it is possible to suppress accumulation of air in the pump chamber P regardless of the posture of the liquid feeder 100.

Figure 18:
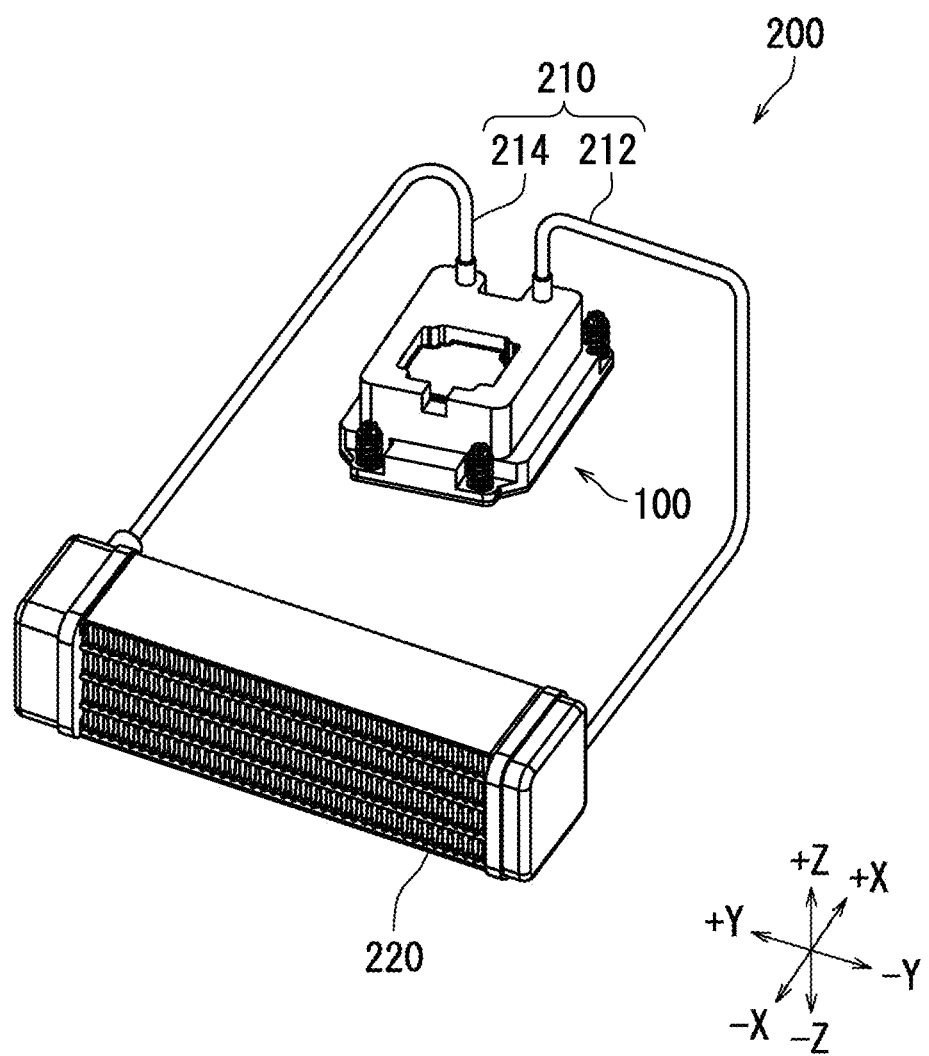
FIG. 18 is a schematic diagram of a cooler having the liquid feeder of the second example embodiment.

Next, the cooler 200 will be described with reference to FIGS. 12 to 18. FIG. 18 is a schematic diagram of the cooler 200. The cooler 200 of the second exemplary example embodiment includes the liquid feeder 100. The cooler 200 is used for cooling the heat generating component.

The cooler 200 includes the liquid feeder 100, the pipe 210, and the radiator 220. The liquid feeder 100 circulates liquid. The liquid feeder 100 sequentially feeds the liquid, so that the liquid circulates in the cooler 200.

The liquid feeder 100 and the radiator 220 are connected with each other via the pipe 210. The liquid feeder 100 feeds the liquid supplied through the pipe 210 toward the radiator 220. The liquid is fed to the radiator 220 through the pipe 210 by the liquid feeder 100. The radiator 220 releases the heat of the liquid flowing through the pipe 210 to the outside, so that the liquid in the pipe 210 is cooled.

When the liquid cooled in the radiator 220 flows to the cold plate 130 of the liquid feeder 100, the heat of the heat generating component is absorbed by the cold plate 130 and the liquid inside.

As described above, the liquid flows through the pipe 210. At this time, the liquid may evaporate through the pipe 210. In particular, when a relatively inexpensive rubber tube is used as the pipe 210 and the cooler 200 is used for a long period of time, the liquid gradually evaporates through the pipe 210, and then the amount of the liquid circulating through the cooler 200 may decrease. According to the liquid feeder 100, idling of the pump 120 can be suppressed even if the amount of liquid circulating in the liquid feeder 100 decreases.

The pipe 210 includes an inflow pipe 212 and an outflow pipe 214. The inflow pipe 212 and the outflow pipe 214 connect the radiator 220 and the liquid feeder 100, respectively. The radiator 220 is connected to at least one of the inflow pipe 212 and the outflow pipe 214. Here, the inflow pipe 212 is connected to the radiator 220 and the inflow port 112 of the liquid feeder 100. The outflow pipe 214 is connected to the radiator 220 and the outflow port 114 of the liquid feeder 100.

The liquid that has absorbed the heat of the heat generating component in the liquid feeder 100 is fed from the liquid feeder 100 toward the radiator 220 through the outflow pipe 214. The radiator 220 releases the heat of the liquid. Thus, the radiator 220 cools the liquid. The liquid in the radiator 220 can be supplied by the liquid feeder 100.

The liquid cooled in the radiator 220 flows to the liquid feeder 100 through the inflow pipe 212. In the liquid feeder 100, the liquid absorbs heat from the heat generating component. The liquid that has absorbed the heat of the heat generating component in the liquid feeder 100 is pushed out again by the liquid feeder 100, and circulates again through the outflow pipe 214 and the inflow pipe 212.

According to the cooler 200 of the present example embodiment, since the liquid cooled in the radiator 220 can be supplied to the cold plate 130 of the liquid feeder 100, the heat of the heat generating component can be efficiently absorbed. According to the cooler 200, idling of the pump 120 can be suppressed regardless of the posture of the liquid feeder 100.

The example embodiments of the present invention are described above with reference to the drawings. However, the present invention is not limited to the above example embodiments, and can be implemented in various aspects without departing from the range of the gist of the present invention. Additionally, the plurality of components disclosed in the above example embodiments can be appropriately modified. For example, one component of all components shown in one example embodiment may be added to a component of another example embodiment, or some components of all components shown in one example embodiment may be eliminated from the one example embodiment.

The drawings schematically illustrate each component mainly to facilitate understanding of the invention, and thus each illustrated component may be different in thickness, length, number, interval, or the like from actual one for convenience of creating the drawings. The configuration of each component described in the above example embodiments is an example, and is not particularly limited. Thus, it is needless to say that various modifications can be made without substantially departing from the range of effects of the present invention.

The present invention is suitably used for, for example, a liquid feeder, a cooling module, and a cooler.

Features of the above-described example embodiments and the modifications thereof may be combined appropriately as long as no conflict arises.

While example embodiments have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A liquid feeder comprising:
a first casing including an inflow port into which liquid flows, an outflow port from which the liquid flows out, and a flow path connecting the inflow port and the outflow port; and
a pump in the flow path of the first casing to circulate the liquid; wherein
the pump includes a pump inlet into which the liquid flows and a pump outlet from which the liquid flows out;
the flow path includes an upstream flow path located upstream of the pump and communicating with the pump inlet, and a downstream flow path located downstream of the pump and communicating with the pump outlet; and
the upstream flow path includes:
a first flow path located on a first side in a first direction with respect to the pump inlet;
a second flow path located on a second side in the first direction with respect to the pump inlet;
a third flow path located on a first side in a second direction orthogonal to the first direction with respect to the pump inlet;
a fourth flow path located on a second side in the second direction with respect to the pump inlet;
a fifth flow path located on a first side in a third direction orthogonal to the first direction and the second direction with respect to the pump inlet; and
a sixth flow path located on a second side in the third direction with respect to the pump inlet;
the first casing includes:
a first outer main surface;
a second outer main surface;
a first outer side surface connected to the first outer main surface and the second outer main surface;
a second outer side surface connected to the first outer main surface and the second outer main surface;

a third outer side surface connected to the first outer main surface, the second outer main surface, the first outer side surface, and the second outer side surface; and a fourth outer side surface connected to the first outer main surface, the second outer main surface, the first outer side surface, and the second outer side surface;

the first outer main surface is provided with a recess; and the pump is in the recess of the first outer main surface.

2. The liquid feeder according to claim 1, wherein the pump includes:

a second casing;

an impeller;

a pump rotation shaft; and a motor to rotate the impeller about the pump rotation axis; and the impeller is housed in a pump chamber located between the first casing and the second casing.

3. The liquid feeder according to claim 2, wherein an end on a first side in the first direction of the first flow path is located on the first side in the first direction with respect to an end on the first side in the first direction of the pump chamber;

an end on a second side in the first direction of the second flow path is located on the second side in the first direction with respect to an end on the second side in the first direction of the pump chamber;

an end on a first side in the second direction of the third flow path is located on the first side in the second direction with respect to an end on the first side in the second direction of the pump chamber;

an end on a second side in the second direction of the fourth flow path is located on the second side in the second direction with respect to an end on the second side in the second direction of the pump chamber;

an end on a first side in the third direction of the fifth flow path is located on the first side in the third direction with respect to an end on the first side in the third direction of the pump chamber; and an end on the second side in the third direction of the sixth flow path is located on the second side in the third direction with respect to an end on the second side in the third direction of the pump chamber.

4. The liquid feeder according to claim 3, wherein the upstream flow path further includes a first tank chamber connected to the inflow port; and the first tank chamber includes at least a portion of the first flow path, at least a portion of the third flow path, at least a portion of the fourth flow path, at least a portion of the fifth flow path, and at least a portion of the sixth flow path.

5. The liquid feeder according to claim 4, wherein the upstream flow path further includes a second tank chamber located on a side opposite to the first tank chamber with respect to the pump chamber; and the second tank chamber includes at least a portion of the second flow path, at least a portion of the third flow path, at least a portion of the fourth flow path, at least a portion of the fifth flow path, and at least a portion of the sixth flow path.

6. The liquid feeder according to claim 5, wherein a volume of the first tank chamber is larger than a volume of the second tank chamber.

7. The liquid feeder according to claim 5, wherein the upstream flow path includes:

a first communication flow path connecting the first tank chamber and the second tank chamber on a first side in the second direction; and a second communication flow path connecting the first tank chamber and the second tank chamber on a second side in the second direction.

8. The liquid feeder according to claim 1, further comprising:

a cold plate in contact with a heat generating component; wherein the sixth flow path is located between the pump and the cold plate.

9. The liquid feeder according to claim 8, further comprising:

a partition plate positioned between the pump and the cold plate; wherein the upstream flow path includes an intermediate flow path as at least a portion of the sixth flow path at a position between the partition plate and the pump.

10. The liquid feeder according to claim 1, wherein the recess of the first outer main surface includes a side surface and a bottom surface;

the bottom surface of the recess includes a normal line which extends along the third direction; and the pump rotation shaft extends parallel to the third direction.

11. The liquid feeder according to claim 1, wherein the first outer side surface is provided with a groove communicating with the recess of the first outer main surface.

12. A cooler comprising:

a liquid feeder;

an inflow pipe connected to an inflow port of the liquid feeder;

an outflow pipe connected to an outflow port of the liquid feeder; and a radiator connected to at least one of the inflow pipe and the outflow pipe; wherein the liquid feeder includes:

a first casing including the inflow port into which liquid flows, the outflow port from which the liquid flows out, and a flow path connecting the inflow port and the outflow port; and a pump that is in the flow path of the first casing and circulates the liquid;

the pump includes a pump inlet into which the liquid flows and a pump outlet from which the liquid flows out;

the flow path includes an upstream flow path located upstream of the pump and communicating with the pump inlet, and a downstream flow path located downstream of the pump and communicating with the pump outlet;

the upstream flow path includes:

a first flow path located on a first side in a first direction with respect to the pump inlet;

a second flow path located on a second side in the first direction with respect to the pump inlet;

a third flow path located on a first side in a second direction orthogonal to the first direction with respect to the pump inlet;

a fourth flow path located on a second side in the second direction with respect to the pump inlet;

a fifth flow path located on a first side in a third direction orthogonal to the first direction and the second direction with respect to the pump inlet; and a sixth flow path located on a second side in the third direction with respect to the pump inlet;

the first casing includes:
  a first outer main surface;
  a second outer main surface;
  a first outer side surface connected to the first outer main surface and the second outer main surface:
  a second outer side surface connected to the first outer main surface and the second outer main surface;
  a third outer side surface connected to the first outer main surface, the second outer main surface, the first outer side surface, and the second outer side surface; and
  a fourth outer side surface connected to the first outer main surface, the second outer main surface, the first outer side surface, and the second outer side surface;

the first outer main surface is provided with a recess; and the pump is in the recess of the first outer main surface.

13. The cooler according to claim 12, wherein
the liquid feeder further includes a cold plate in contact with a heat generating component; and
the sixth flow path is located between the pump and the cold plate.

14. The cooler according to claim 13, wherein
the liquid feeder further includes a partition plate positioned between the pump and the cold plate; and
the upstream flow path includes an intermediate flow path as at least a portion of the sixth flow path at a position between the partition plate and the pump.

\* \* \* \* \*